United States Patent
Douglas et al.

(10) Patent No.: US 9,773,718 B2
(45) Date of Patent: Sep. 26, 2017

(54) WINGED HEAT SINK

(71) Applicant: Oracle International Corporation, Redwood City, CA (US)

(72) Inventors: David C. Douglas, Palo Alto, CA (US); David W. Copeland, Mountain View, CA (US); Bruce M. Guenin, San Diego, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 224 days.

(21) Appl. No.: 14/250,237

(22) Filed: Apr. 10, 2014

(65) Prior Publication Data
US 2015/0043168 A1  Feb. 12, 2015

Related U.S. Application Data

(60) Provisional application No. 61/972,936, filed on Mar. 31, 2014, provisional application No. 61/863,057, filed on Aug. 7, 2013.

(51) Int. Cl.
| | |
|---|---|
| *H05K 7/20* | (2006.01) |
| *H01L 23/427* | (2006.01) |
| *H01L 23/367* | (2006.01) |
| *H01L 23/42* | (2006.01) |
| *H01L 21/48* | (2006.01) |

(52) U.S. Cl.
CPC ........ *H01L 23/427* (2013.01); *H01L 21/4882* (2013.01); *H01L 23/3672* (2013.01); *H01L 23/42* (2013.01); *H01L 2224/16225* (2013.01); *H01L 2224/73253* (2013.01); *H01L 2924/0002* (2013.01); *H01L 2924/16152* (2013.01)

(58) Field of Classification Search
CPC ..................... H01L 23/427; H01L 2023/4056
See application file for complete search history.

(56) References Cited

U.S. PATENT DOCUMENTS

| | | | | |
|---|---|---|---|---|
| 5,515,912 A * | 5/1996 | Daikoku | ............. | H01L 23/4338 165/185 |
| 5,651,414 A * | 7/1997 | Suzuki | ................ | F28D 15/0275 165/104.14 |
| 5,924,481 A * | 7/1999 | Tajima | ................ | F28D 15/0266 165/104.21 |
| 6,065,530 A * | 5/2000 | Austin | ................. | H05K 7/2039 165/185 |
| 6,189,601 B1 * | 2/2001 | Goodman | ........... | F28D 15/0233 165/104.33 |
| 6,446,708 B1 * | 9/2002 | Lai | ........................... | F28F 3/02 165/185 |

(Continued)

*Primary Examiner* — Robert J Hoffberg
(74) *Attorney, Agent, or Firm* — Park, Vaughan, Fleming & Dowler LLP

(57) ABSTRACT

A winged heat sink includes one or more arms that transport heat from a pedestal that is thermally coupled to an integrated circuit to convective fins. For example, the one or more arms may include one or more heat pipes. Moreover, the arms extend the vertical position of the winged heat sink away from a plane of the pedestal so that the convective fins extend downward back toward a circuit board on which the integrated circuit is mounted. These downward facing fins may match the topologies of components on the underlying circuit board.

20 Claims, 21 Drawing Sheets

(56) References Cited

U.S. PATENT DOCUMENTS

| | | | | |
|---|---|---|---|---|
| 6,450,249 B1 * | 9/2002 | Liu | H01L 23/3672 165/185 |
| 6,466,441 B1 * | 10/2002 | Suzuki | H05K 7/20154 165/104.33 |
| 6,687,126 B2 * | 2/2004 | Patel | G06F 1/20 361/679.46 |
| 6,832,410 B2 * | 12/2004 | Hegde | H01L 23/367 165/121 |
| 6,840,311 B2 * | 1/2005 | Ghosh | F28D 15/0233 165/104.33 |
| 6,906,922 B2 * | 6/2005 | Yu | H05K 7/20154 165/121 |
| 7,028,758 B2 * | 4/2006 | Sheng | F28F 1/32 165/104.21 |
| 7,110,259 B2 * | 9/2006 | Lee | H01L 23/427 165/104.33 |
| 7,128,131 B2 * | 10/2006 | Kubo | H01L 23/3672 165/104.33 |
| 7,269,012 B2 * | 9/2007 | Lee | G06F 1/20 165/80.3 |
| 7,269,014 B1 * | 9/2007 | Zhao | H01L 23/4006 165/104.33 |
| 7,319,588 B2 * | 1/2008 | Peng | H01L 23/427 165/104.21 |
| 7,391,614 B2 * | 6/2008 | Artman | H01L 23/367 165/185 |
| 7,443,677 B1 * | 10/2008 | Zhou | F28D 15/0275 165/104.21 |
| 7,497,249 B2 * | 3/2009 | Bhatti | F28D 15/0233 165/104.33 |
| 7,595,989 B2 * | 9/2009 | Liu | H01L 23/427 165/104.33 |
| 7,606,027 B2 * | 10/2009 | Takasou | H05K 7/20154 165/122 |
| 7,791,883 B2 * | 9/2010 | Lin | F28D 15/0266 165/104.33 |
| 7,808,780 B2 * | 10/2010 | Brunschwiler | G06F 1/20 165/104.33 |
| 7,866,173 B2 * | 1/2011 | Brunschwiler | G06F 1/206 361/699 |
| 8,004,832 B2 * | 8/2011 | Brunschwiler | G06F 1/20 165/104.33 |
| 8,020,611 B2 * | 9/2011 | Liu | H01L 23/427 165/104.33 |
| 8,107,234 B2 * | 1/2012 | Brunschwiler | G06F 1/20 165/104.33 |
| 8,496,047 B2 * | 7/2013 | Chang | F28D 15/0266 165/104.21 |
| 8,737,061 B2 * | 5/2014 | Chang | F28D 15/02 165/104.33 |
| 9,390,994 B2 * | 7/2016 | Guenin | H01L 23/3672 |
| 2009/0151895 A1 * | 6/2009 | Liu | F28D 15/0275 165/80.2 |
| 2014/0160679 A1 * | 6/2014 | Kelty | H05K 7/20672 361/700 |
| 2015/0043167 A1 * | 2/2015 | Guenin | H01L 23/3672 361/719 |

\* cited by examiner

```
                                                              ─2000
┌─────────────────────────────────────────────────────────────────┐
│  CONDUCT HEAT AWAY FROM A FIRST INTEGRATED CIRCUIT USING A FIRST │
│  HEAT SINK MECHANICALLY COUPLED TO THE FIRST INTEGRATED CIRCUIT  │
│                              2010                                │
└─────────────────────────────────────────────────────────────────┘
                                  │
                                  ▼
┌─────────────────────────────────────────────────────────────────┐
│    CONDUCT HEAT AWAY FROM A SECOND INTEGRATED CIRCUIT USING A    │
│      SECOND HEAT SINK MECHANICALLY COUPLED TO THE SECOND         │
│                       INTEGRATED CIRCUIT                         │
│                              2012                                │
└─────────────────────────────────────────────────────────────────┘
```

```
┌─────────────────────────────────────────────────────────────┐
│  TRANSPORT HEAT FROM AN INTEGRATED CIRCUIT TO CONVECTIVE FINS│
│              USING AN ARM IN A HEAT SINK                    │
│                          2110                               │
│   ┌─────────────────────────────────────────────────────┐  │
│   │  SPREAD THE HEAT OVER THE HEAT SINK USING A HEAT-SINK│  │
│   │                    BASE (OPTIONAL)                   │  │
│   │                         2112                         │  │
│   └─────────────────────────────────────────────────────┘  │
└─────────────────────────────────────────────────────────────┘
                              │
                              ▼
┌─────────────────────────────────────────────────────────────┐
│  CONVECTIVELY COOL THE CONVECTIVE FINS, WHERE THE CONVECTIVE│
│   FINS EXTEND DOWNWARD FROM THE ARM BACK TOWARDS THE        │
│                    INTEGRATED CIRCUIT                       │
│                          2114                               │
└─────────────────────────────────────────────────────────────┘
                              │
                              ▼
┌─────────────────────────────────────────────────────────────┐
│   TRANSPORT HEAT FROM THE INTEGRATED CIRCUIT TO ADDITIONAL  │
│            CONVECTIVE FINS USING THE ARM                    │
│                       (OPTIONAL)                            │
│                          2116                               │
└─────────────────────────────────────────────────────────────┘
                              │
                              ▼
┌─────────────────────────────────────────────────────────────┐
│        CONVECTIVELY COOL THE ADDITIONAL CONVECTIVE FINS     │
│                       (OPTIONAL)                            │
│                          2118                               │
└─────────────────────────────────────────────────────────────┘
```

FIG. 21

WINGED HEAT SINK

CROSS-REFERENCE TO RELATED APPLICATION

This application claims priority under 35 U.S.C. §119(e) to U.S. Provisional Application Ser. No. 61,972,936, entitled "Winged Heat Sink", by David. C. Douglas, David W. Copeland, and Bruce M. Guenin, filed on Mar. 31, 2014. This application also claims priority under 35 U.S.C. §119 (e) to U.S. Provisional Application Ser. No. 61/863,057, entitled "Integrated Heat Pipe Heat Sink," by Bruce M. Guenin and David W. Copeland, filed on Aug. 7, 2013, the contents of which are herein incorporated by reference.

This application is related to U.S. Non-provisional patent application Ser. No. 14/205,233, entitled "Heat Sinks with Interdigitated Heat Pipes," by Bruce M. Guenin and David W. Copeland, filed on Apr. 10, 2014, the contents of which are herein incorporated by reference.

BACKGROUND

Field

The present disclosure generally relates to a chip package for semiconductor dies or chips. More specifically, the present disclosure relates to a chip package with a winged heat sink having a vertical displacement and downward facing fins.

Related Art

In the design of computers and other systems with devices having high thermal loads, heat sinks are often applied to the thermal load device to dissipate heat energy from the devices to the surrounding air (which is typically fan driven). Heat sinks come in a variety of forms and contain a variety of technologies. For cooling high-powered devices, it is common for heat sinks to be thermally attached with a thermal-interface material between the heat sinks and the devices, and for the heat sinks to overhang the devices in such a way as to present a large plane to which convective fins can be attached. Moreover, the thermal path in the base of the heat sink can be solid metal or may be augmented by other devices, such as heat pipes.

However, the heat sinks often restrict the ability to place components near the high-powered device because of mechanical interference. In addition, the heat sinks are also often performance limited when the air flow is not near the high-powered thermal device. This problem is common to a wide variety of high thermal-load components and, particularly, to computer processors.

For example, processors may be placed at the center of an edge of a circuit board with related components (such as voltage-regulator modules) positioned nearby. However, voltage-regulator modules may be tall devices, which can restrict air flow and present height issues. In addition, the air intakes (which provide the air flow) may be located at the outside edges away from the edge that includes the processors. Consequently, it can be difficult to cool processors in this configuration.

Hence, what is needed is a heat sink without the above-described problems.

SUMMARY

One embodiment of the present disclosure provides a heat sink that includes: a pedestal that is to thermally couple to an integrated circuit mounted on a circuit board; an arm thermally coupled to the pedestal, where the arm extends a vertical position of the heat sink from a plane of the pedestal to a second vertical position, which is further away from the circuit board; and convective fins thermally coupled to the arm, where the convective fins extend downward from the arm back toward the circuit board.

In some embodiments, the heat sink further includes a second arm, thermally coupled to the pedestal, on an opposite side of the integrated circuit. The second arm extends the vertical position of the heat sink, and the second arm is thermally coupled to the convective fins.

Moreover, the heat sink may include additional fins thermally coupled to the arm. The additional fins may extend upward away from the circuit board. Alternatively or additionally, the additional fins may extend approximately parallel to the plane of the pedestal.

During operation, the heat sink may transport heat from the integrated circuit to the convective fins.

In some embodiments, the heat sink includes multiple arms arranged adjacent to each other. In these embodiments, during operation, the heat sink transports heat from the integrated circuit in two dimensions to the convective fins.

Furthermore, the heat sink may include a heat-sink base thermally coupled to at least a portion of the arm, where the heat-sink base spreads the heat over the arm.

Another embodiment provides a system that includes the integrated circuit mounted on the circuit board and the heat sink.

Moreover, the system may include a component, having a height, mounted on the circuit board proximate to the integrated circuit. The second vertical position of the heat sink may clear the height.

Furthermore, the convective fins may have different lengths to accommodate the height of the component.

Another embodiment provides a method for cooling an integrated circuit using a heat sink. During the method, heat is transported from the integrated circuit to the convective fins using the arm in the heat sink, where the arm extends the vertical position of the heat sink from a plane of the integrated circuit to the second vertical position, which is further away from the integrated circuit. Then, the convective fins are convectively cooled, where the convective fins extend downward from the arm back toward the integrated circuit.

In some embodiments, during the transport, the heat is spread over the heat sink using the heat-sink base in the heat sink.

Moreover, in some embodiments the heat is transported from the integrated circuit to the additional convective fins using the arm, where the additional convective fins extend upward away from the integrated circuit and/or extend approximately parallel to the plane of the integrated circuit. Then, the additional convective fins are convectively cooled.

BRIEF DESCRIPTION OF THE FIGURES

FIG. 20 is a flow diagram illustrating a method for cooling a first integrated circuit and a second integrated circuit during operation of the first integrated circuit and the second integrated circuit in accordance with an embodiment of the present disclosure.

FIG. 21 is a flow diagram illustrating a method for cooling an integrated circuit using a heat sink in accordance with an embodiment of the present disclosure.

Note that like reference numerals refer to corresponding parts throughout the drawings. Moreover, multiple instances of the same part are designated by a common prefix separated from an instance number by a dash.

DETAILED DESCRIPTION

Embodiments of a winged heat sink, a system that includes the winged heat sink, and a technique for cooling an integrated circuit using a winged heat sink are described. This winged heat sink includes one or more arms that transport heat from a pedestal that is thermally coupled to an integrated circuit to convective fins. For example, the one or more arms may include one or more heat pipes. Moreover, the arms extend the vertical position of the winged heat sink away from a plane of the pedestal so that the convective fins extend downward back towards a circuit board on which the integrated circuit is mounted.

By changing the vertical position of the one or more arms in the winged heat sink, the convective fins may be displaced away from components adjacent or proximate to the integrated circuit and/or may be located where the air flow is higher. Thus, the winged heat sink may allow the improved thermal performance while accommodating the local topology of the circuit board.

We now describe the chip package. Thermal management during operation of integrated circuits is often based on heat sinks that include heat pipes. The very high effective thermal conductivity of a heat pipe enhances the transport of heat over the length of the heat pipe, from a region of the heat pipe in contact with an integrated circuit to convective fins. In particular, the heat pipe may include a wall-and-wick structure. During operation, there is an open volume for vapor transport of a heated gas, and there is a counterflow of a cooled liquid in the wick structure.

Figure 1:
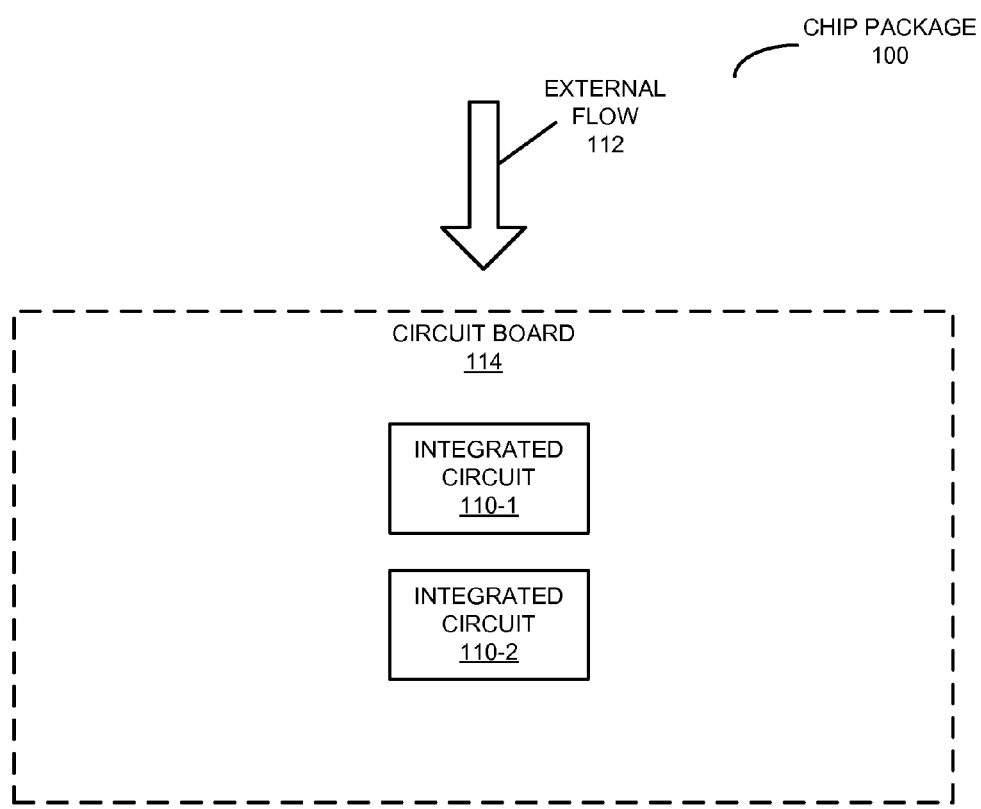
FIG. 1 is a block diagram illustrating a top view of integrated circuits having an in-line configuration in a chip package in accordance with an embodiment of the present disclosure.

The interdigitation of heat pipes in heat sinks for adjacent or proximate integrated circuits is a function of the configuration of the integrated circuits. FIG. 1 presents a block diagram illustrating a top view of integrated circuits 110 having an in-line configuration in a chip package 100. In the in-line configuration, an external fluid (such as air) has a flow direction 112, and integrated circuit 110-1 and integrated circuit 110-2 are arranged adjacent to each other on circuit board 114 along flow direction 112.

Figure 2:
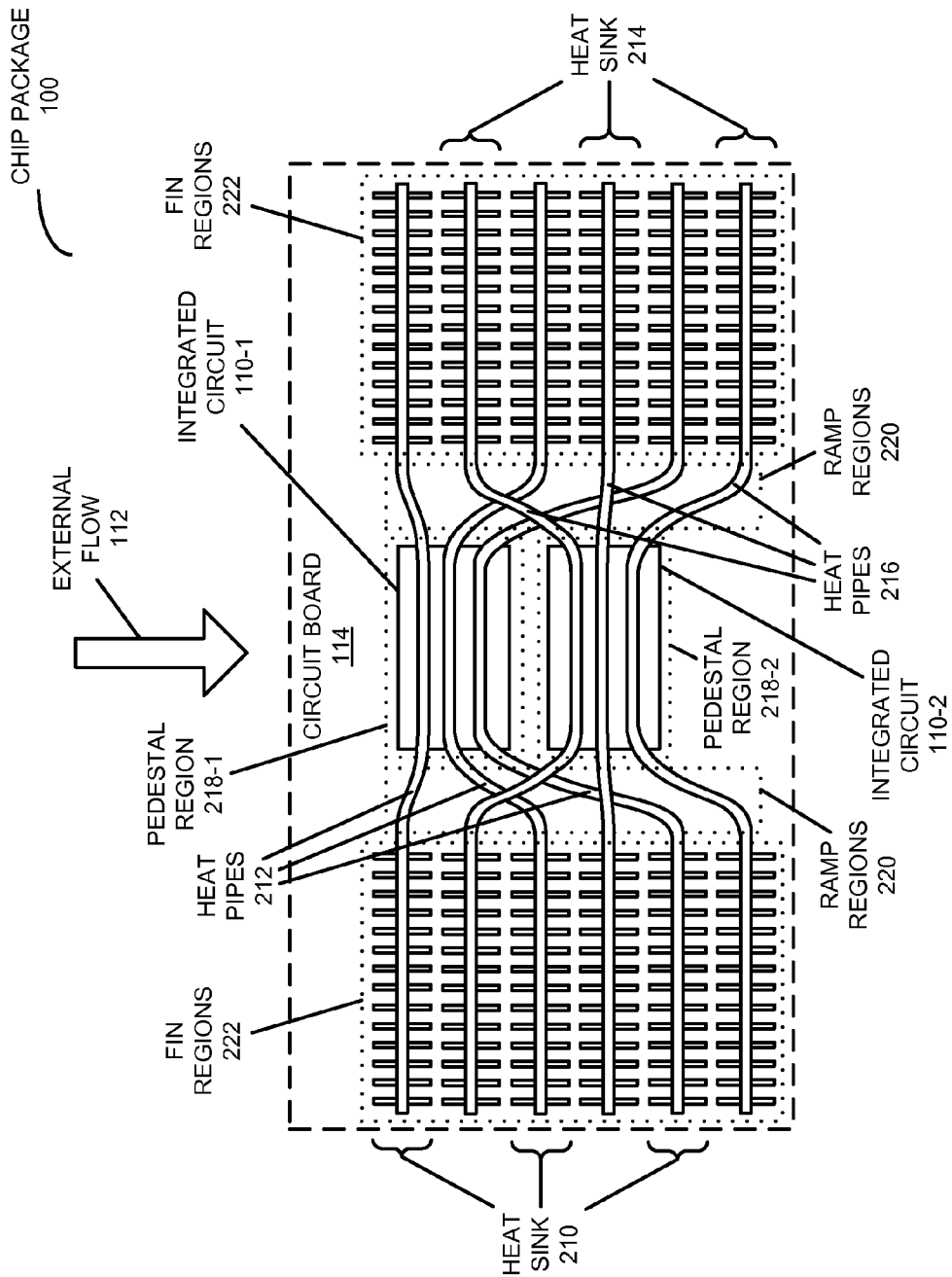
FIG. 2 is a block diagram illustrating a top view of interdigitated heat pipes in heat sinks in the chip package of FIG. 1 in accordance with an embodiment of the present disclosure.
Figure 3:
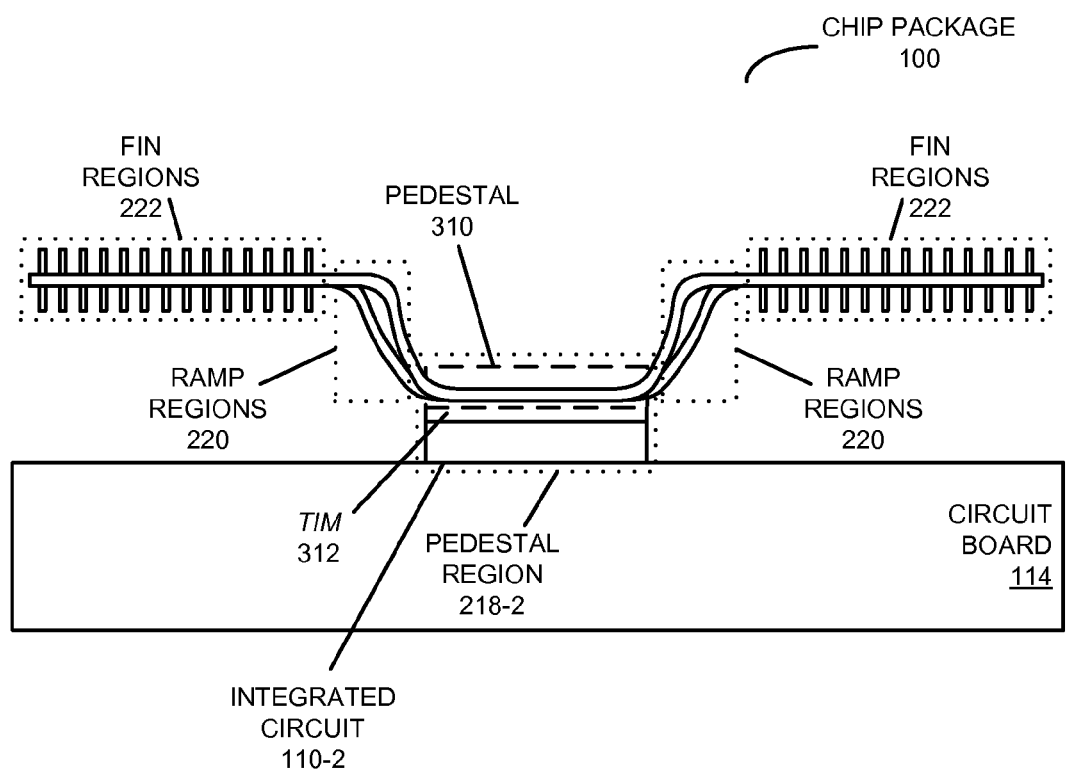
FIG. 3 is a block diagram illustrating a side view of the interdigitated heat pipes in the heat sinks of FIG. 1 in accordance with an embodiment of the present disclosure.

FIG. 2 presents a block diagram illustrating a top view of interdigitated heat pipes 212 and 216 in heat sinks 210 and 214 in chip package 100, and FIG. 3 presents a block diagram illustrating a side view of chip package 100. In particular, heat sink 210 includes heat pipes 212 that conduct heat away from integrated circuit 110-1 during operation of integrated circuit 110-1; and heat sink 214 includes heat pipes 216 that conduct heat away from integrated circuit 110-2 during operation of integrated circuit 110-2. A given heat sink for a given integrated circuit includes: a pedestal region (such as pedestal regions 218) mechanically coupled to the given integrated circuit; a ramp region (such as ramp regions 220) that extends a vertical position of a portion of the given heat sink; and a fin region (such as fin regions 222) having fins that convectively transfer the heat to the external fluid (such as the air). (Note that the fins in fin regions 222 may extend over a full width of circuit board 114.) Furthermore, heat pipes 212 in the fin region of heat sink 210 are interdigitated with heat pipes 216 in the fin region of heat sink 214.

Note that the pedestal of the given heat sink in the pedestal region (such as pedestal 310 in FIG. 3) is typically copper, aluminum or another metal alloy. (Similarly, the fins may be copper, aluminum or another material.) The heat pipes in the pedestal region are often flattened to provide good contact and, thus, to improve the thermal impedance with the top surface of the given integrated circuit. Moreover, the pedestal is typically thermally coupled to the given integrated circuit by a thermal-interface material (TIM) 312, such as: indium foil, carbon sheet, metal particulate impregnated grease, thermal grease, etc. Note that the heat pipes may be thermally coupled to the heat-sink base using a low-melting-point solder.

Furthermore, note that ramp regions 220 often include simple 's-bends.' In particular, ramp regions 220 of heat sinks 210 and 214 curve upwards at different distances from integrated circuits 110 so they do not mechanically interfere with each other. Note that heat sinks 210 and 214 are self-aligning with the top surface of the integrated-circuit packages. In this way, chip package 100 may address challenges such as non-coplanar top surfaces of integrated circuits 110.

Figure 5:
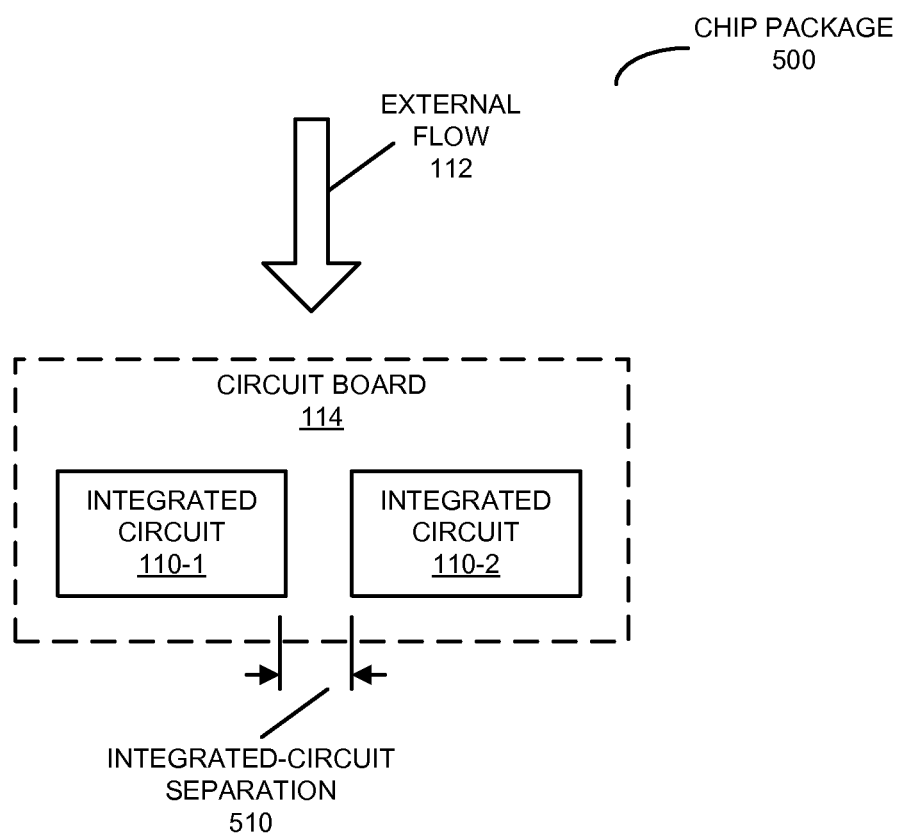
FIG. 5 is a block diagram illustrating a top view of integrated circuits having a lateral configuration in a chip package in accordance with an embodiment of the present disclosure.

In general, interdigitation of heat pipes 212 and 216 in heat sinks 210 and 214 is easier for the in-line configuration of integrated circuits 110 than for a lateral configuration (which is described further below with reference to FIG. 5). In particular, note that only the portions of heat pipes 212 and 216 in fin regions 222 are interdigitated in FIG. 2, while the portions in the ramp regions 220 are merely nested.

The heat pipes for use when the integrated circuits have the in-line configuration may be assembled using the following assembly technique. Heat sink 210 (which has a shallower slope in the ramp region) is positioned on top of integrated circuit 110-1 with a thermal-interface material between them. Then, a clamping fixture for heat sink 210 is adjusted to a specified force.

Next, heat sink 214 (which has a steeper slope in the ramp region) is positioned on top of integrated circuit 110-2 with a thermal-interface material between them. Then, a clamping fixture for heat sink 214 is adjusted to a specified force.

Note that the assembly technique may involve a downward vertical translation of the heat sink 214 to its final position. While fin regions 222 of heat sinks 210 and 214 are interdigitated, the ramp region of heat sink 214 is nested within the ramp region of heat sink 210. This approach may allow flexibility in the design of the fins.

Figure 4:
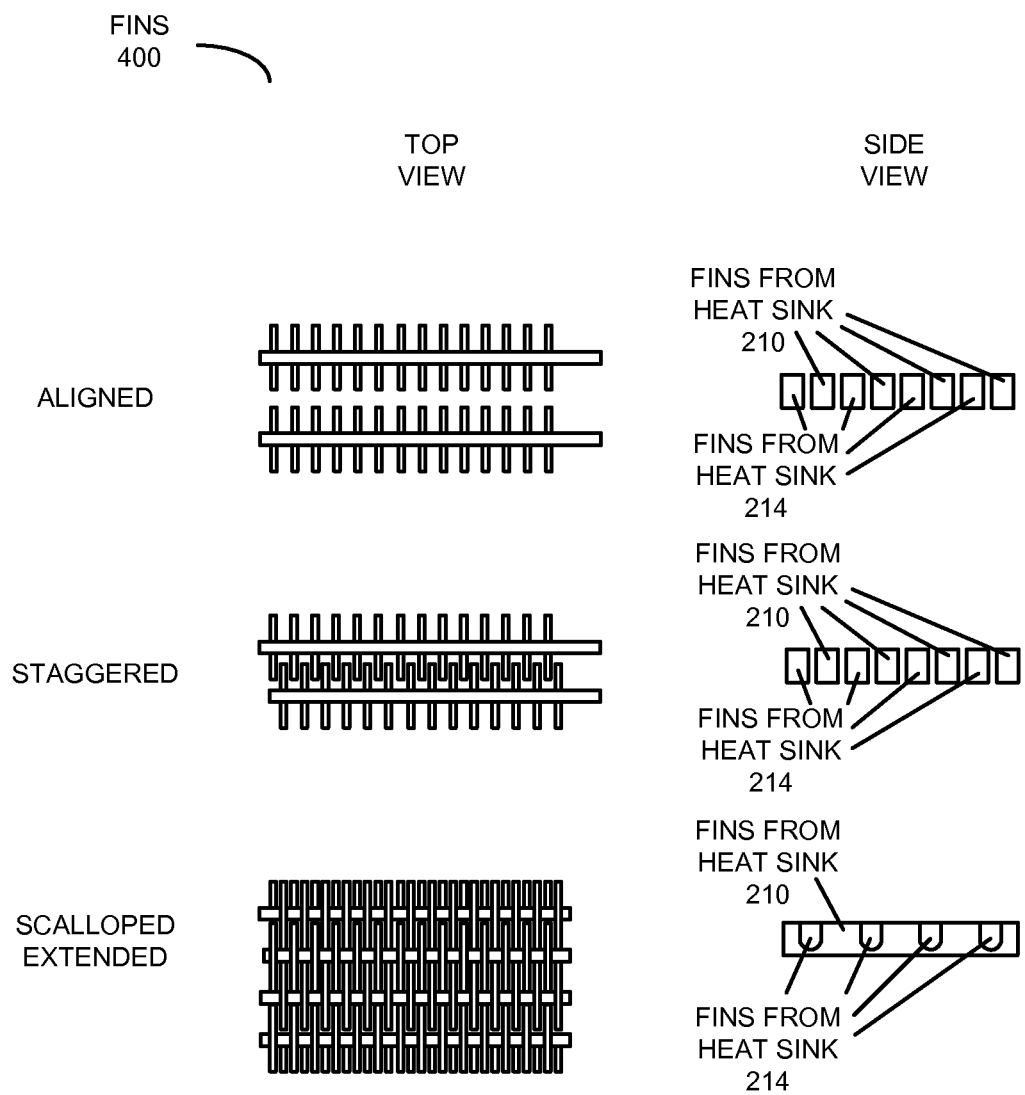
FIG. 4 is a block diagram illustrating a top view of fins in fin regions of the heat sinks of FIG. 1 in accordance with an embodiment of the present disclosure.

FIG. 4 presents a block diagram illustrating a top view of fins 400 in fin regions 222 of heat sinks 210 and 214 in FIG. 2. Note that the fins in the fin region of heat sink 210 and the fins in the fin region of heat sink 214 may be: aligned, staggered and/or overlapped (or extended). Note that 'staggered fins' may overlap between the heatpipes so that they almost touch the heatpipes to which they are not connected; while the 'scalloped extended fins' extend even further, so that the heatpipes fit with a little bit of clearance into the scallops of the fins which are attached to the other heatpipes. The use of so-called 'singulated' fins may allow the use of tall or longer fins in a vertical direction. In other embodiments, however, scalloped, extended fins are used. These extended fins may provide more area and greater stability than singulated fins. In some embodiments, the heat-pipe regions of the heat sinks have different elevations or heights. This may allow the use of a configuration in which the fins from the two heat sinks are interleaved vertically (with one set pointing downward and another set pointed upward).

We now describe heat sinks for use in the lateral configuration of the integrated circuits. FIG. 5 presents a block diagram illustrating a top view of integrated circuits 110 having a lateral configuration in a chip package 500. In particular, integrated circuit 110-1 and integrated circuit 110-2 are arranged perpendicular to flow direction 112 with an integrated-circuit separation 510.

The lateral configuration poses several design challenges. Notably, the heat pipes from one heat sink may overhang the pedestal region of a neighboring heat sink. Consequently, the ramp regions of the two heat sinks cannot be simply nested. For close integrated-circuit separations, the heat pipes in the ramp regions may also have to be interdigitated. Furthermore, in general the assembly technique used for the in-line configuration (which was described previously) may not be applicable to the lateral configuration.

Figure 6:
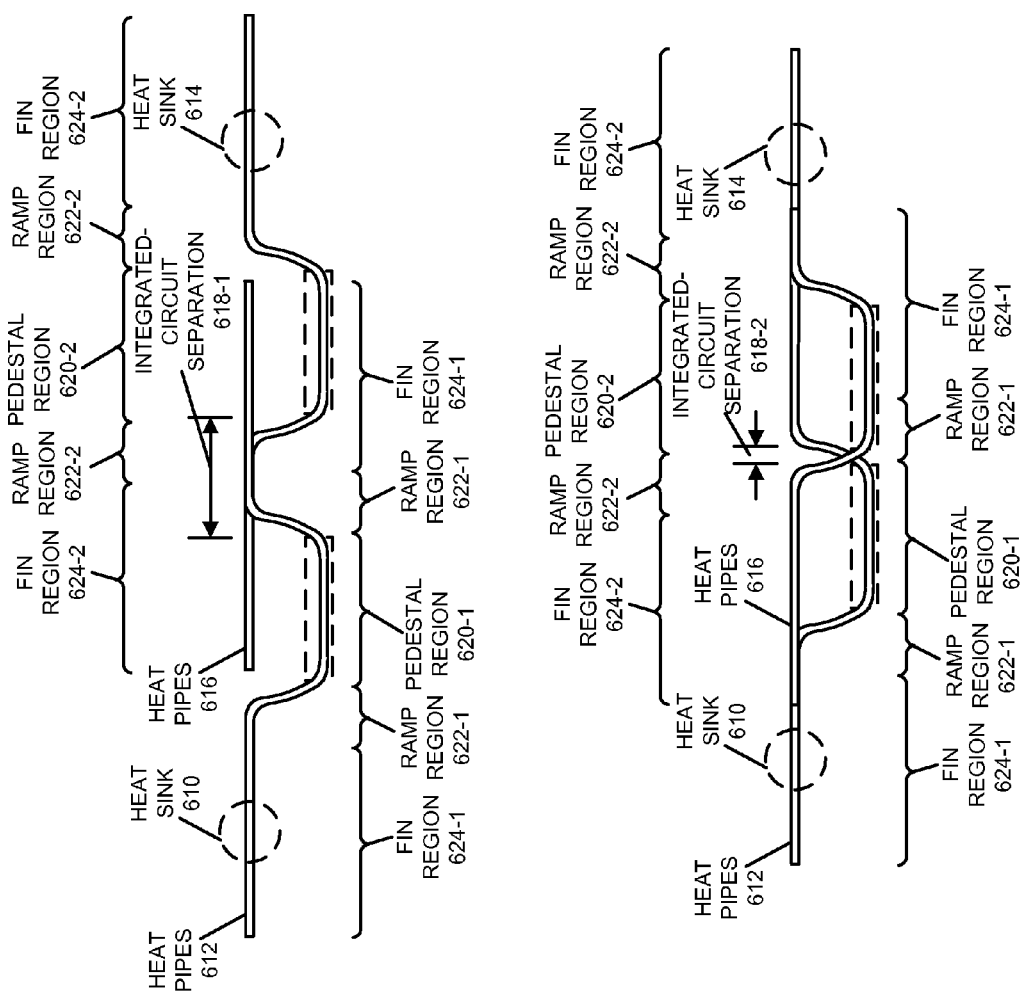
FIG. 6 is a block diagram illustrating a side view of interdigitated heat pipes in the heat sinks in the chip package of FIG. 5 as a function of integrated-circuit separation in accordance with an embodiment of the present disclosure.

FIG. 6 presents a block diagram illustrating a side view of interdigitation of heat pipes 612 and 616 in heat sinks 610 and 614 in chip package 500 (FIG. 5) as a function of integrated-circuit separation 618. Heat pipes 612 of heat sink 610 in at least a portion of ramp region 622-1 of heat sink 610 are interdigitated with heat pipes 616 of heat sink 614 in at least a portion of ramp region 622-2 of heat sink 614. Furthermore, heat pipes 612 of heat sink 610 in at least a portion of pedestal region 620-1 of heat sink 610 may be interdigitated with heat pipes 616 of heat sink 614 in at least a portion of pedestal region 620-2 of heat sink 614. Thus, heat sinks 610 and 614 may be interdigitated in ramp regions 622 and fin regions 624 or in pedestal regions 620, ramp regions 622 and fin regions 624. For clarity, note that the fins are not shown in FIG. 6.

In general, the degree of interdigitation depends on the integrated-circuit separation and a height difference between the top of the pedestals and the lower edge of an interdigitated zone of ramp regions 622. For example, if the integrated-circuit separation or the lateral spacing is large enough, heat pipes 612 and 616 may only be interdigitated in fin regions 624. As the lateral spacing is reduced, heat pipes 612 and 616 may be interdigitated at the top of ramp regions 622. Furthermore, with further reduction in the lateral spacing, heat pipes 612 and 616 may be interdigitated at the bottom of ramp regions 622. Additionally, with even further reduction in the lateral spacing, heat pipes 612 and 616 may be interdigitated in pedestal regions 620. Consequently, the closest lateral spacings may result in interdigitation over most of the lengths of heat pipes 612 and 616.

Figure 7:
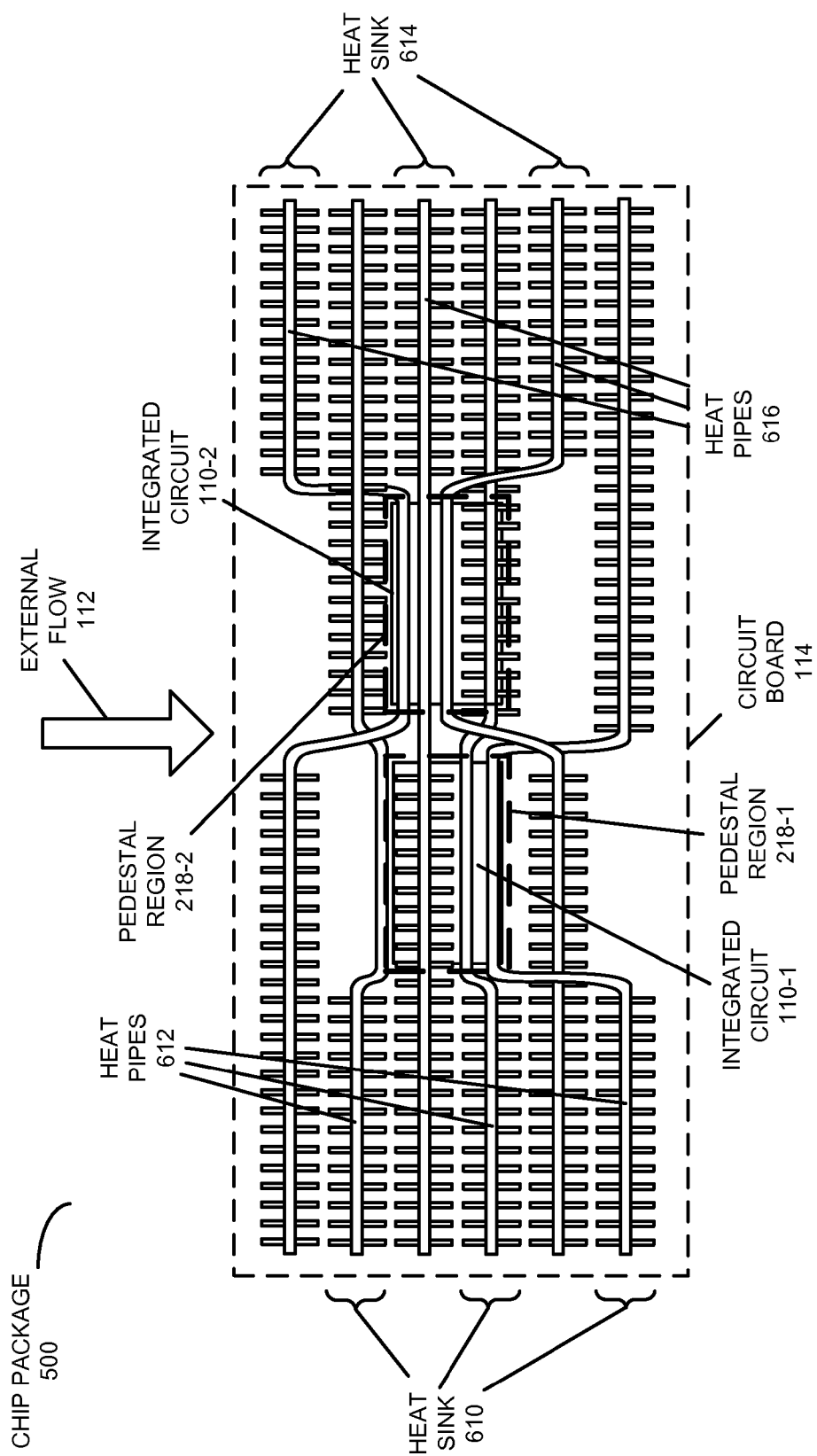
FIG. 7 is a block diagram illustrating a top view of interdigitated heat pipes in heat sinks in the chip package of FIG. 5 in accordance with an embodiment of the present disclosure.

FIG. 7 presents a block diagram illustrating a top view of interdigitated heat pipes 612 and 616 in heat sinks 610 and 614 (FIG. 6) in chip package 500.

The ability to interdigitate heat pipes from one heat sink with those of another in the ramp regions and the pedestal regions also depends on the heat-pipe separation at the precise value of the lateral separation. In general, the separation between the heat pipes depends on: the height difference, the heat-pipe pitch in the pedestal region, the heat-pipe pitch in the fin region, the fan-out angle and the heat-pipe thickness at a particular location. For interdigitation to be possible, the separation of the heat pipes usually must be greater than the heat-pipe thickness at each heat-pipe location.

Figure 8:
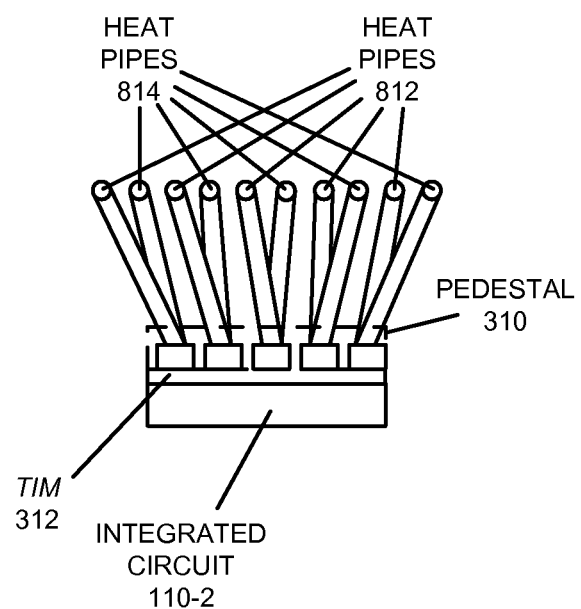
FIG. 8 is a block diagram illustrating a side view of interdigitated heat pipes in pedestal regions in the heat sinks of FIG. 5 in accordance with an embodiment of the present disclosure.

A variety of designs may be used in the pedestal region to facilitate interdigitation of heat pipes in heat sinks. FIG. 8 presents a block diagram illustrating a side view of interdigitated heat pipes 812 and 814 in the pedestal regions of heat sinks 610 and 614 (FIG. 6). In these embodiments, heat pipes 812 in the pedestal region of heat sink 610 may be aligned with heat pipes 814 in the pedestal region of heat sink 614. In particular, heat pipes 812 and 814 may be soldered to bottom surfaces of pedestals in the pedestal regions. Moreover, heat pipes 812 and 814 in the pedestal regions may be aligned. When the pedestal is about the same size as the integrated circuit, the heat pipes are in uniform thermal contact with the top surface of the integrated circuit. However, because heat pipes 812 and 814 terminate at the same locations in the pedestals, the minimum value of the height separation in the interdigitated zone of the ramp regions is some distance from the top of the pedestals (i.e., there is a minimum possible height separation). This may limit the minimum lateral separation between the two pedestals.

Figure 9:
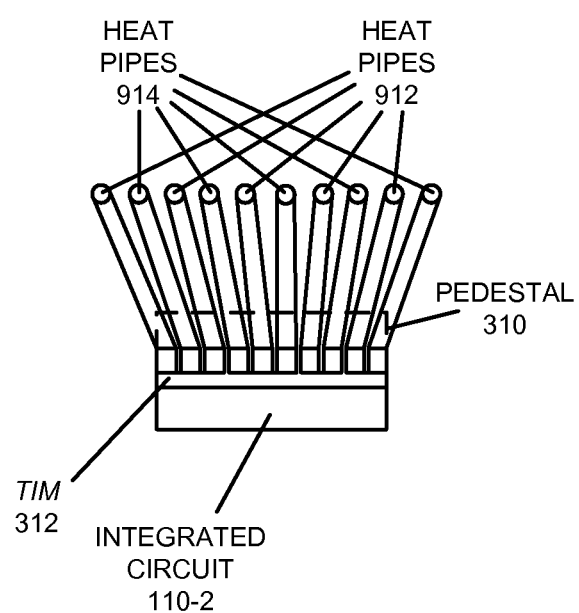
FIG. 9 is a block diagram illustrating a side view of interdigitated heat pipes in the pedestal regions in the heat sinks of FIG. 5 in accordance with an embodiment of the present disclosure.

FIG. 9 presents a block diagram illustrating a side view of interdigitated heat pipes 912 and 914 in the pedestal regions of heat sinks 610 and 614 (FIG. 6). In this example, heat pipes 912 and 914 may be soldered to bottom surfaces of the pedestals in the pedestal regions. Moreover, heat pipes 912 in the pedestal region of heat sink 610 may be staggered between heat pipes 914 in the pedestal region of heat sink 614. In particular, the heat pipes in one pedestal may be offset by the pitch with respect to those in the other pedestal. Note that a cross-section of heat pipes 912 in the pedestal region of heat sink 610 and a cross-section of heat pipes 914 in the pedestal region of heat sink 614 may be modified at interdigitated locations. For example, the heat pipes can be 'squished' at interdigitated locations to facilitate a smaller pitch.

Note that each of the pedestals may be a bit oversized with respect to the outline of the integrated circuits because the two integrated circuits may need to be co-linear. When heat pipes 912 and 914 in the pedestal regions are fully interdigitated, the height difference may be negative and the mechanical interference between heat pipes 912 and 914 may no longer be the limiting factor controlling the separation between the pedestals. Instead, the limiting factor may be the contact between the heat pipes of one heat sink with the pedestal of the other. Consequently, in this case, the minimum separation may be determined by the bending radius of the heat pipes, etc.

Figure 10:
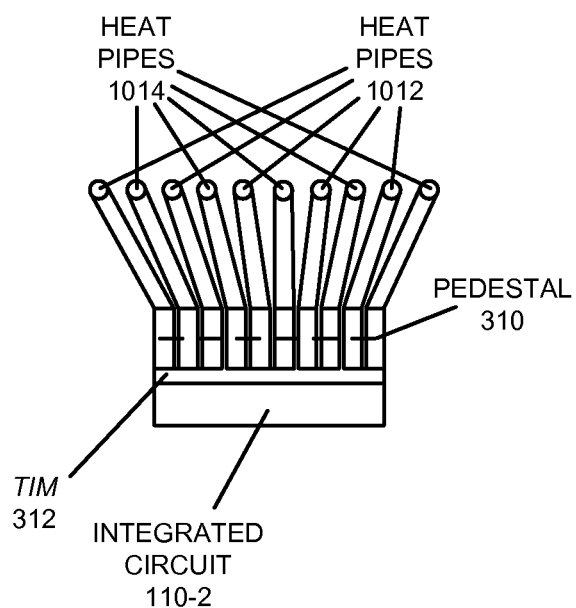
FIG. 10 is a block diagram illustrating a side view of interdigitated heat pipes in the pedestal regions in the heat sinks of FIG. 5 in accordance with an embodiment of the present disclosure.

FIG. 10 presents a block diagram illustrating a side view of interdigitated heat pipes 1012 and 1014 in the pedestal regions of heat sinks 610 and 614 (FIG. 6). This example shows a so-called zero-clearance configuration. In particular, there are bends in heat pipes 1012 and 1014, which route them vertically from the plane of the pedestals. The upper portions of heat pipes 1012 and 1014 fan out laterally. When viewed end on, heat pipes 1012 and 1014 interdigitate over the entire length (including regions within the footprint of the pedestals), which allows the integrated-circuit separation to be reduced. In this example, heat pipes 1012 and 1014 may be soldered to mounting lands on top of copper pedestals. Note that copper is typically used because of its high thermal conductivity. In the pedestal regions, heat pipes 1012 and 1014 may have square cross-sections.

Using the zero-clearance configuration, heat pipes 1012 and 1014 and fins from heat sinks 610 and 614 (FIG. 6) do not contact each other even for zero clearance between the pedestals. As a practical matter, given the tolerances in manufacturing, some clearance is typically needed to prevent the pedestals from contacting because such contact would jeopardize their mechanical independence from each other.

Figure 11:
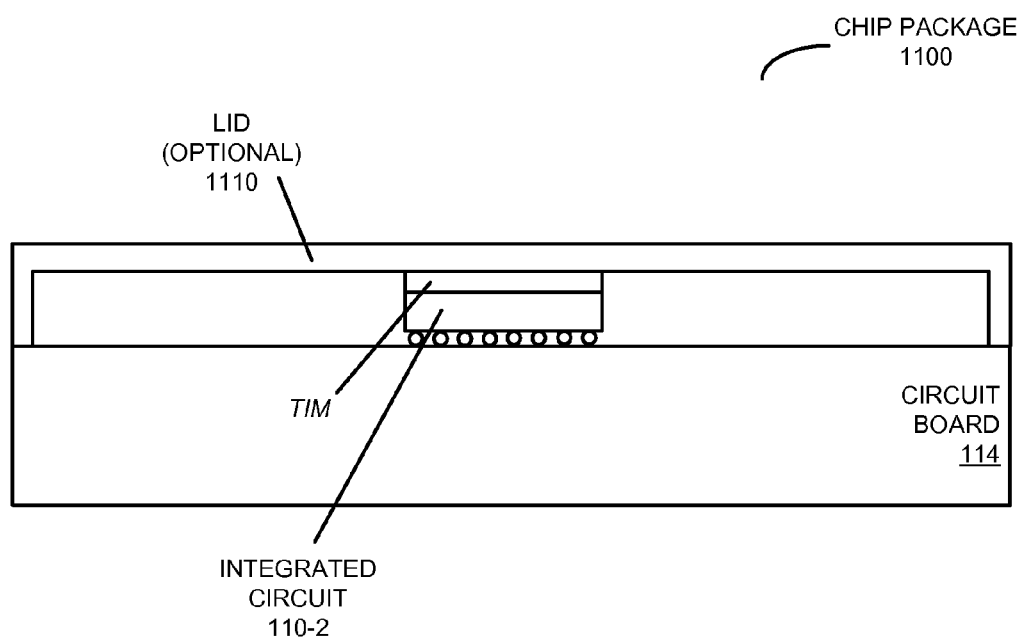
FIG. 11 is a block diagram illustrating a side view of a chip package in accordance with an embodiment of the present disclosure.

In general, the chip package may include an optional lid and/or an optional pedestal in the pedestal region of the given heat sink. This is shown in FIG. 11, which presents a block diagram illustrating a side view of a chip package 1100. In particular, chip package 1100 includes an optional lid 1110 (which provides protection during handling of chip package 1100). Note that optional lid 1110 may be made of copper. In addition, there may be a flange to clamp a given heat pipe to a given integrated circuit. The clamping force applied to the given heat sink using the flange may keep the given heat sink aligned with the given integrated circuit. For example, the clamping force may be applied using a screw/spring assembly.

In particular, when there is a large integrated-circuit separation, the flanges can extend laterally beyond the integrated-circuit package toward the centerline with the other integrated circuit. The additional routing length of the heat pipes with wider flanges may enhance heat-load balancing between different heat pipes. Alternatively, for moderate and/or close integrated-circuit separation, the extension of the flanges in the lateral direction may be small (particularly in the direction of the other integrated circuit) in order to manage the more aggressive interdigitation of the heat pipes in the ramp regions. Furthermore, on the side of the flange away from the other integrated circuit, the tolerances for the lateral flange extension and the proximity of the heat-pipe ramp region to the edge of the flange may be more relaxed.

In some embodiments, chip package 1100 has no lid (which is sometimes referred to as a 'bare-die package'). This configuration may provide thermal advantages. It may also allow the pedestals to be significantly smaller than the package substrate.

The integrated-circuit separation on a circuit board may be determined by signal-integrity and trace-routing considerations and a need to locate other components nearby. In general, the pedestals for a bare (lidless) die are about the same size as the die, and the pedestals for a lidded package can range from about the same size as the die to about the same size as the package. Consequently, for the same integrated-circuit spacing, the heat-sink pedestals for cooling lidless packages may have a greater separation than for lidded packages. This implies that a less aggressive interdigitation strategy may be needed for a lidless package compared to a lidded one for the same integrated-circuit separation. Thus, there may not need to be interdigitation in the ramp regions for a lidless package, while this may be needed for a lidded package.

We now describe pedestal design for lidless chip packages. Integrated circuits often have regions of high heat flux compared with the average heat flux over the entire die. The copper lid on a lidded chip package helps spread out the heat from these hot spots as it flows to the heat-sink pedestals and, thus, helps reduce the peak temperatures. In turn, this can result in more-efficient cooling and less of a chance of exceeding the local ability of the heat pipes to remove heat. Consequently, as shown in FIG. 11, in many cases it may be necessary to use heat sinks with copper pedestals at the interfaces with the integrated circuits, with the heat pipes attached to the top of the pedestals.

In principle, aligned or staggered heat pipes can be used in the pedestal region for lidless chip packages. For the same integrated-circuit separation, there is typically greater heat-sink pedestal separation when a pedestal is used. This may reduce the chance of mechanical interference between the heat pipes of one heat sink and the pedestal of the neighboring heat sink for small pedestal separations.

If the previous design approaches provide insufficient cooling of hot spots, additional techniques can be used. These techniques usually modify the common width of the heat pipes in the heat sinks and/or the common thickness of the pedestals. In particular, for the portions of the pedestal/heat-pipe assembly overlapping regions of the highest heat flux: the width of the flattened heat pipes may be reduced to reduce the total power transported by each heat pipe; and/or the local thickness of the pedestal may be increased to spread the heat more uniformly over the heat pipe.

Figure 12:
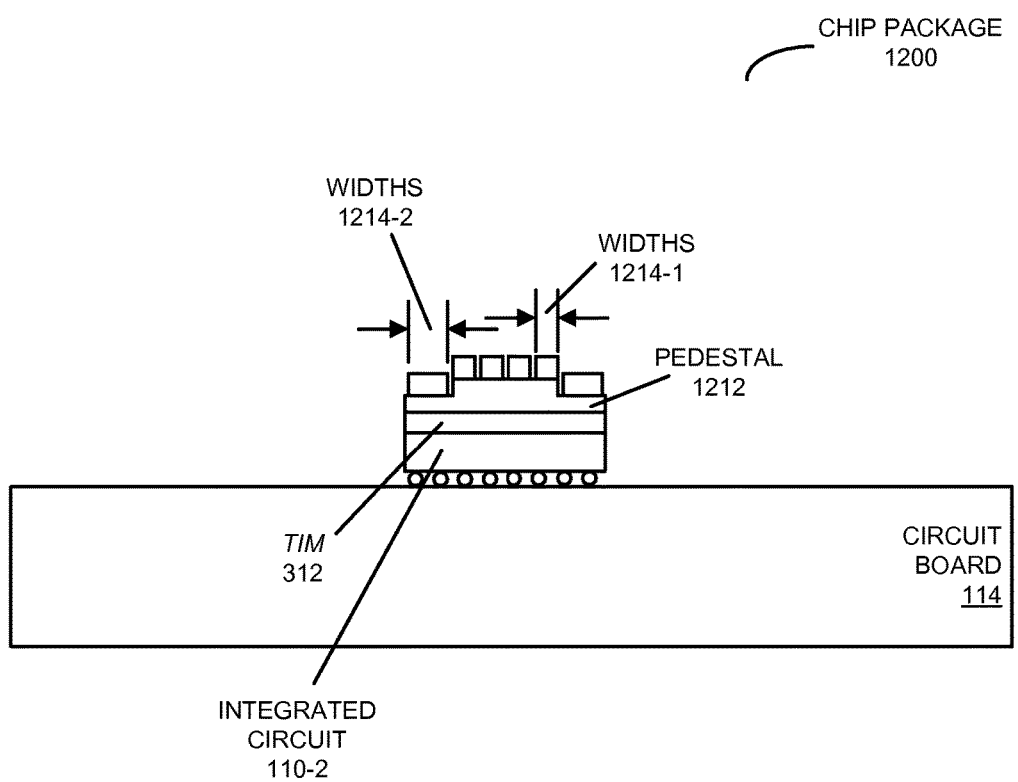
FIG. 12 is a block diagram illustrating a side view of a pedestal region of one of the heat sinks of FIG. 5 and an associated pedestal in accordance with an embodiment of the present disclosure.

This is shown in FIG. 12, which presents a block diagram illustrating a side view of a pedestal region and an associated pedestal 1212 of one of heat sinks 610 and 614 (FIG. 6) in chip package 1200. In FIG. 12, widths 1214 of at least a subset of the heat pipes of the given heat sink may be varied over lengths of at least the subset of the heat pipes. Furthermore, a thickness of the given pedestal may be varied over a width of the given pedestal.

We now describe assembly techniques for use with integrated circuits in the lateral configuration. In a lateral-translation assembly technique, thermal-interface material may be applied to both integrated circuits. Then, the first heat sink may be positioned on top of the first integrated circuit, and the clamping fixture for the first heat sink may be adjusted to a specified force. Next, in a downward motion, the right fin region of the second heat sink may be interdigitated with the fin region of the first heat sink, stopping slightly above the final elevation. Moreover, the second heat sink may be translated horizontally toward the center of the first heat sink until the center of the second heat sink lines up with the integrated-circuit package (while avoiding disturbance of the thermal-interface material on the second integrated circuit). Furthermore, the second heat-sink clamping fixture may be adjusted to a specified force.

For heat pipes with a double s-bend in the ramp regions, the lateral-translation assembly technique may require short fin lengths, which may limit the thermal-cooling efficiency. While variable fin lengths may be used, this may result in a variable thermal resistance among the heat pipes. Alternatively, adding an additional bend to create a vertical routing path for the heat pipes (as shown in FIG. 10) may facilitate longer fin lengths.

In general, the lateral-translation assembly technique allows sequential mounting of the heat sinks. This assembly technique may be used with singulated fins having a width less than a heat-pipe pitch in the fin regions.

Alternatively, in an orthogonal-insertion assembly technique, singulated fins in heat pipes may be assembled by rotating two heat sinks together like the blades in a pair of scissors. In particular, a first heat sink may be held in a horizontal position. Then, the second heat sink may be translated vertically while the fin region of the second heat sink interdigitates with the fin region of the first heat sink. This translation may stop when the ramp region of the second heat sink reaches the fin region of the first heat sink. Next, the second heat sink may be rotated by 90° until its fin region is coplanar with that of the first heat sink so that the heat pipes can be interdigitated in the desired manner. Note that the heat sinks may be kept in rough alignment as they are lowered as a pair to each contact their respective integrated circuit (with previously applied thermal-interface material). Furthermore, individual clamping fixtures of the heat sinks may be sequentially adjusted to obtain a specified force.

The orthogonal-insertion assembly technique may be modified if there are extended fins in the heat sinks. In particular, the first operation in the assembly technique may be the same except that the heat pipes of the second heat sink being interdigitated with those of the first heat sink may have no fins attached. After this operation, the fins may be attached to the heat pipes in the second heat sink. Next, the second heat sink may be rotated by 90°, and the heat sinks may be interdigitated in the desired manner.

In the orthogonal-insertion assembly technique, either aligned or staggered singulated fins may be used. For scalloped, extended fins, the fins can be mounted on both wings of the first (horizontal) heat sink and the lower wing of the second (vertical) heat sink prior to insertion. Then, the fins can be mounted to the upper wing of the second heat sink following insertion.

Note that the orthogonal-insertion assembly technique may allow the use of fins having a longer lower portion than the lateral-insertion assembly technique. Consequently, the orthogonal-insertion assembly technique may be more suitable for low-profile heat sinks than the lateral-insertion assembly technique. If the orthogonal-insertion assembly technique is used with additional bends for vertical routing, there can be zero clearance between pedestals. However, the heat sinks typically need to be interdigitated first and then mounted as a loosely coupled pair. This assembly technique works with staggered fins having a width greater than a heat-pipe pitch in the fin region. In some embodiments, the fins are curved for use with the orthogonal-insertion assembly technique.

For either assembly technique, in air-flow regions where only one heat sink has fins, it may be necessary to have a locally reduced fin pitch to maintain a uniform flow impedance (in particular, in order to minimize bypass flow). Alternatively, it may be necessary to attach a local baffle to block the bypass flow. In some embodiments, the fin pitch of a heat sink in locally reduced (relative to the pitch of the fins in the remainder of the heat sink) in a region directly above the pedestal of the other heat sink. This configuration may result in a uniform fin pitch to air flow when two such heat sinks are interdigitated because the interdigitated fins in the remainders of the heat sink may match that in the region with the locally reduced pitch (where the fins are not interdigitated).

In some embodiments, there may be heat-transfer advantages (such as less obstructed airflow) if the heat sinks have different vertical heights. In these configurations, the heat pipes can even serve to channel flow into a region at a height range bounded by the two rows of heat pipes. As described further below, in these embodiments enhanced fin structures are possible in which there is a wider strip of continuous metal from the leading edge to the trailing edge.

Figure 13:
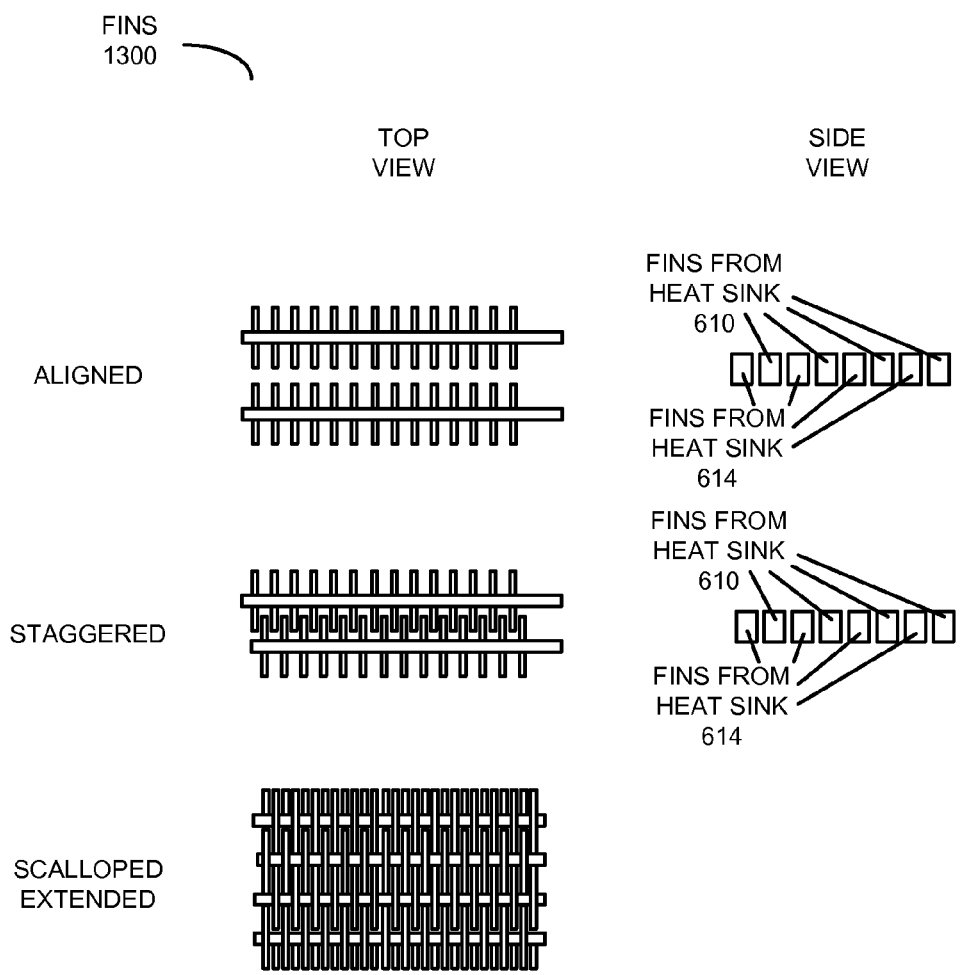
FIG. 13 is a block diagram illustrating a top view of fins in fin regions of the heat sinks of FIG. 5 in accordance with an embodiment of the present disclosure.

FIG. 13 presents a block diagram illustrating a top view of fins 1300 in the fin regions of heat sinks 610 and 614 (FIG. 6). Note that the fins in the fin region of heat sink 610 and the fins in the fin region of heat sink 614 may be: aligned, staggered and/or overlapped. Once again, note that 'staggered fins' may overlap between the heatpipes so that they almost touch the heatpipes to which they are not connected; while the 'scalloped extended fins' extend even further, so that the heatpipes fit with a little bit of clearance into the scallops of the fins which are attached to the other heatpipes. In addition, as discussed previously, scalloped extended fins or enhanced extended fins may be used. In general, a variety of fin shapes (which may just barely clear board components of multiple heights) may be used (e.g., with an upside-down or baseless heatsink).

Figure 14:
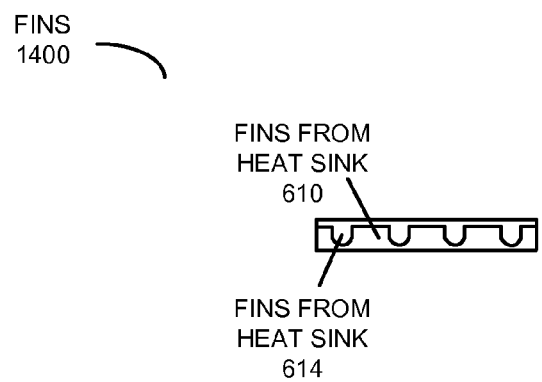
FIG. 14 is a block diagram illustrating a top view of fins in fin regions of the heat sinks of FIG. 5 in accordance with an embodiment of the present disclosure.

As described below with reference to FIGS. 15A and 15B, in some embodiments the heat sinks have different vertical heights or elevations. This may allow the use of different types of scalloped extended fins. FIG. 14 presents a block diagram illustrating a top view of fins 1400 in the fin regions of heat sinks 610 and 614 (FIG. 6). Note that the fins in the fin region of heat sink 610 and the fins in the fin region of heat sink 614 may be overlapped. In this example, a fin-down base may be soldered to an upper heat pipe and fin-up base may be soldered to a lower heat pipe. Moreover, the fins in heat sinks 610 and 614 may be interleaved. This configuration allows use of parallel plate fins for improved efficiency and a uniform fin width from the leading edge to the trailing edge.

Figure 15A:
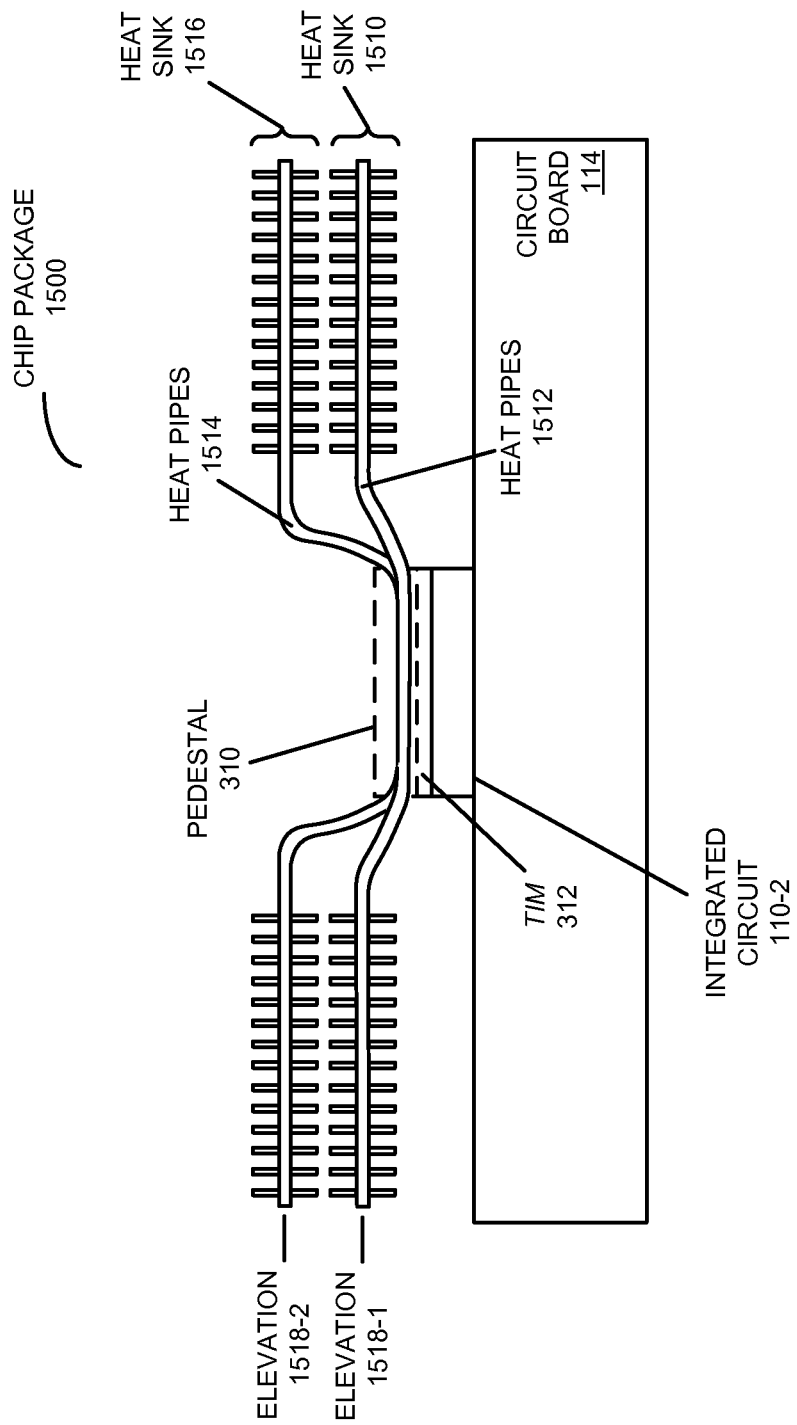
FIG. 15A is a block diagram illustrating a side view of heat pipes in heat sinks having different elevations in accordance with an embodiment of the present disclosure.

FIG. 15A, which presents a block diagram illustrating a side view of heat pipes 1512 and 1514 in chip package 1500 having different elevations 1518 in heat sinks 1510 and 1516. In particular, the fin region of heat sink 1510 may have a different vertical position than the fin region of heat sink 1516. Note that the given heat sink may include heat pipes having a vertical portion and bends so that heat sink 1510 and heat sink 1516 are interdigitated in the pedestal regions, the ramp regions and the fin regions of heat sinks 1510 and 1516.

Moreover, heat pipes 1512 and 1514 may or may not be interdigitated in FIG. 15A. For example, in embodiments where they are not interdigitated, the lower half of the heat pipes may be attached to the upstream pedestal and the upper half of the heat pipes may be attached to the downstream pedestal.

During assembly of the configuration shown in FIG. 15A with the in-line configuration of the integrated circuits, heat sink 1510 with the lower fin-region heat pipes may be mounted first. Because the direction of movement of heat pipes 1514 may be directed downward during assembly, heat sink 1510 may have a lower fin region on both wings. Conversely, heat sink 1516 may have an upper fin region on both wings.

Figure 15B:
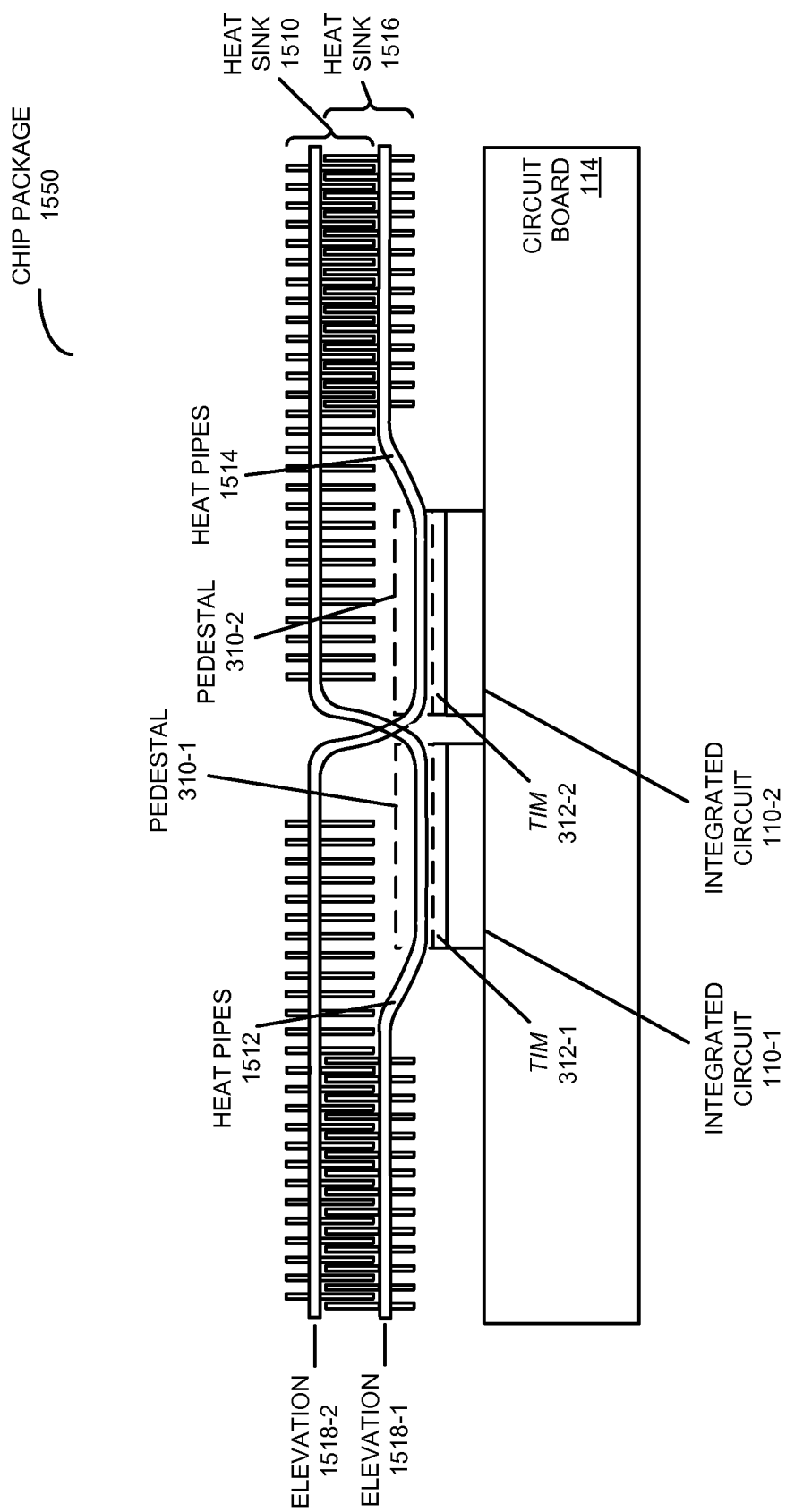
FIG. 15B is a block diagram illustrating a side view of heat pipes in heat sinks having different elevations in accordance with an embodiment of the present disclosure.

FIG. 15B presents a block diagram illustrating a side view of heat pipes 1512 and 1514 in chip package 1550 having different elevations 1518 in heat sinks 1510 and 1516 for a lateral configuration. Note that heat pipes 1512 and 1514 may or may not be interdigitated in this configuration.

In some embodiments, a base assembly with integral fins is soldered to flattened heat pipes in the fin region to achieve a design with a single-elevation heat-pipe region. In particular, each of the heat sinks may have a fin structure in which the fins are soldered to one side of a plate. The other side of the plate is then soldered to flattened heat pipes of only one of the heat sinks in the fin region. Thus, each heat sink may be assembled from two pieces. Each of the pieces may have flattened heat pipes arranged on a surface. These heat pipes may be interdigitated parallel to each other when the two pieces are soldered together (so that the surfaces of the two pieces are parallel to each other and face each other with the fins from each of the two plates extending in opposite directions), thereby implementing the heat sink. Care is taken during the soldering operation to ensure that the plate for a given heat sink is not soldered to the heat pipes of the other heat sink. This is to maintain the mechanical independence of the two heat sinks.

The thermal-management technique may be applied to cooling larger arrays of integrated circuits, such as a 2×2 or N×M (where N and M are integers) array of integrated circuits. This may involve the assembly of two heat-sink pairs. Each of the heat-sink pairs may have a lateral configuration of two heat sinks with interdigitated heat pipes. The first heat-sink pair may have a ramp region extending farther out than the ramp region of the second heat-sink pair. This may allow the first heat-sink pair and the second heat-sink pair to be nested (as described previously for the in-line configuration). If desired, the embodiments and techniques described previously can be used to enable near contact between the pedestals of the four individual heat sinks.

In some embodiments, the heat sinks have curved fins to provide proper clearance between the fins of the two heat sinks to facilitate an orthogonal-insertion assembly technique when the fin pitch is very small. Moreover, the flange may be designed to enable interdigitation of heat pipes at various pedestal separations. In addition, mechanical independence of the interdigitated heat sinks may constrain the geometry of the heat pipes.

The preceding embodiments of the thermal-management technique with heat sinks having interdigitated heat pipes may be used separately from or in conjunction with embodiments of a winged heat sink. The winged heat sink uses sets of heat pipes to create an effective thermal path and thermal distribution from a thermal load (such as an integrated circuit) to heat dissipation or convective fins located at a high airflow area, while maximizing available board area and available headroom for components near the thermal load, such as voltage-regulator modules (however, voltage-regulator modules are often tall devices that can restrict air flow and present height issues, notably when the height of the voltage-regulator modules nears or exceeds the height of the processor).

In particular, the winged heat sink may maximize the elevation of the thermal path associated with the winged heat sink above a circuit board (particularly near the processor) so that fin orientation of the winged heat sink can be inverted, thereby allowing taller components and other components to be placed nearby. For example, downward facing fins on the winged heat sink may match the topologies of components on an underlying circuit board. The winged heat sink may also maximize the flexibility of the thermal path to place the thermal load in maximally effective airflows, and may increase potential cooling fin cross-sections and depth in the maximally effective airflows. In particular, the heat pipes may be routed to any region of the system where the heat flow is greatest. In addition, the winged heat sink may minimize parts and production costs.

These improvements associated with the winged heat sink may be a function of using thermal transfer devices to move the heat load and a changed focus from uniform heat rejection fins to maximizing the use of heat rejection fins principally in the area of highest airflow. In the discussion that follows, heat sinks with heat pipes are used as illustrations of the thermal transfer device. However, in other embodiments the winged heat sink may be used with other thermal transfer devices (including those that exclude heat pipes).

Figure 16:
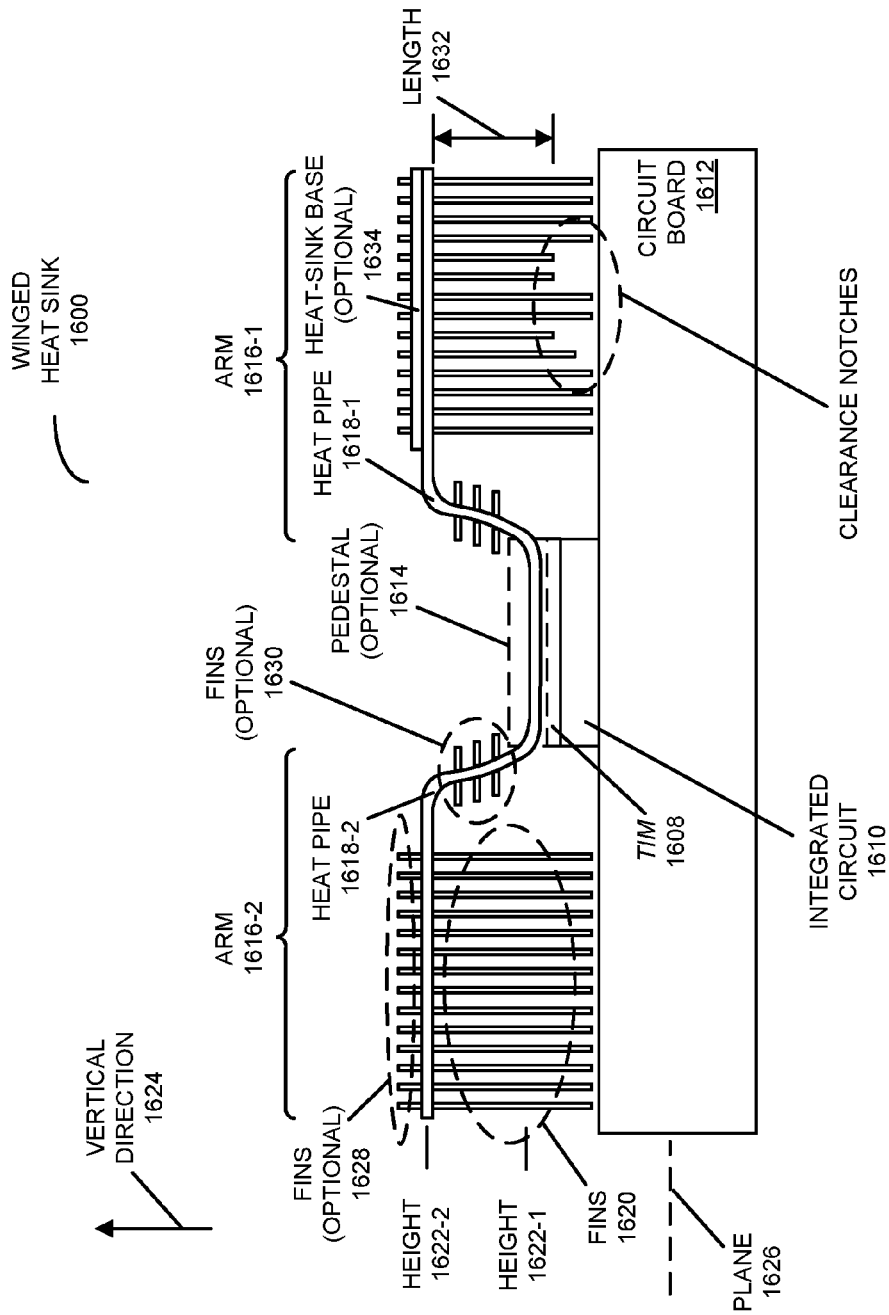
FIG. 16 is a block diagram illustrating a side view of a winged heat sink in accordance with an embodiment of the present disclosure.

FIG. 16 presents a block diagram illustrating a side view of a winged heat sink 1600. In this winged heat sink, one or more heat pipes 1618 transfer heat from an optional pedestal 1614 (which is thermally coupled to integrated circuit 1610, for example, by thermal-interface material 1608) to fins 1620. (Thus, winged heat sink 1600 may have one or more arms 1616. Embodiments with one arm may be used when there is single source of cooling air flow.) Note that fins 1620 may be optimized in size, orientation and attachment to an optional pedestal 1614. Furthermore, fins 1620 may be directly attached to one or more arms 1616 to provide a reduced-cost, high-thermal efficiency configuration. In addition, fins 1620 may spread the thermal load to provide a larger fin length in the direction of the air flow(s). This spreading of the thermal load may be asymmetric in multiple dimensions.

Moreover, the one or more heat pipes 1618 extends height 1622 of winged heat sink 1600 along vertical direction 1624. Furthermore, note that fins 1620 are facing downward toward circuit board 1612 on which integrated circuit 1610 is mounted (i.e., toward plane 1626 of integrated circuit 1610 and/or pedestal 1614). In this way, winged heat sink 1600 may match a topology (defined by other components) of circuit board 1612 in proximity to integrated circuit 1610.

In some embodiments, winged heat sink 1600 includes optional upward-facing fins 1628 and/or optional fins 1630 along sides of winged heat sink 1600.

Moreover, fins 1620 may have variable lengths (such as length 1632) along the one or more heat pipes 1618 and/or in a direction into the plane of FIG. 16. Thus, variable lengths may be along one dimension or two dimensions of winged heat sink 1600. This may provide additional degrees of freedom to accommodate the topology of the other components and, more generally, circuit board 1612. For example, the variable-length fins may provide clearances or notches to clear components and optimize cooling efficiency and effectiveness.

Note that winged heat sink 1600 may include an optional copper plate (such as a heat-sink base) or an optional heat-sink base 1634. In some embodiments, heat-sink base 1634 is cooled using a pumped liquid that flows through it. This optional heat-sink base may spread the transported heat so the liquid in the one or more heat pipes 1618 does not dry up. Moreover, optional heat-sink base 1634 may be located above or below the one or more heat pipes 1618 at pedestal 1614. More generally, optional heat-sink base 1634 may be located along some or all of the length of the one or more heat pipes 1618, and may be located above, below or around the one or more heat pipes 1618. Furthermore, optional heat-sink base 1634 may be distributed asymmetrically around winged heat sink 1600.

Figure 17:
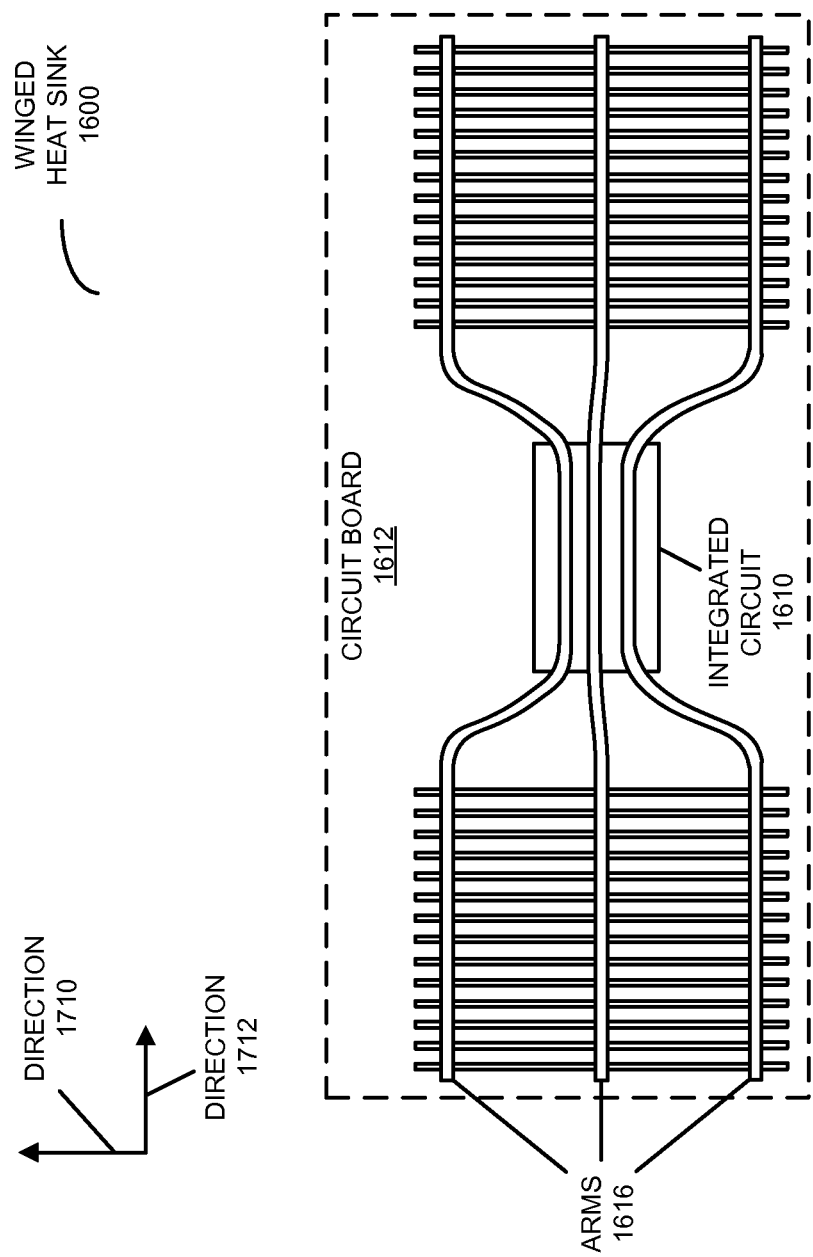
FIG. 17 is a block diagram illustrating a top view of a winged heat sink in accordance with an embodiment of the present disclosure.

As shown in FIG. 17, which presents a block diagram illustrating a top view of a winged heat sink 1600, the winged heat sink may include multiple (quasi-parallel) arms 1616. This may facilitate heat transport along directions 1710 and/or 1712, which may allow more surface area for fins in regions of circuit board 1612 where there are no or fewer components.

The winged heat sink may allow large components (such as a voltage-regulator module and/or other integrated circuits) to be placed near integrated circuit 1610 by vertically clearing the adjacent circuit-board area, and/or may improve the thermal-fin area in the effective cooling air flows (which may be relevant in the case where the air flows do not pass over integrated circuit 1610). Thus, the winged heat sink may: improve the thermal path through component elimination, lower the weight of the heat sink (which may reduce the effects of shock and vibration), and reduce cost by eliminating parts in the heat sink.

In an exemplary embodiment, the winged heat sink is used in blade-type server system designs in which electrical connectors occupy the space otherwise preferred for cooling air flows. However, the winged heat sink may be used in other applications of computer design, power conversions and other industries where high-powered components are cooled.

Figure 18:
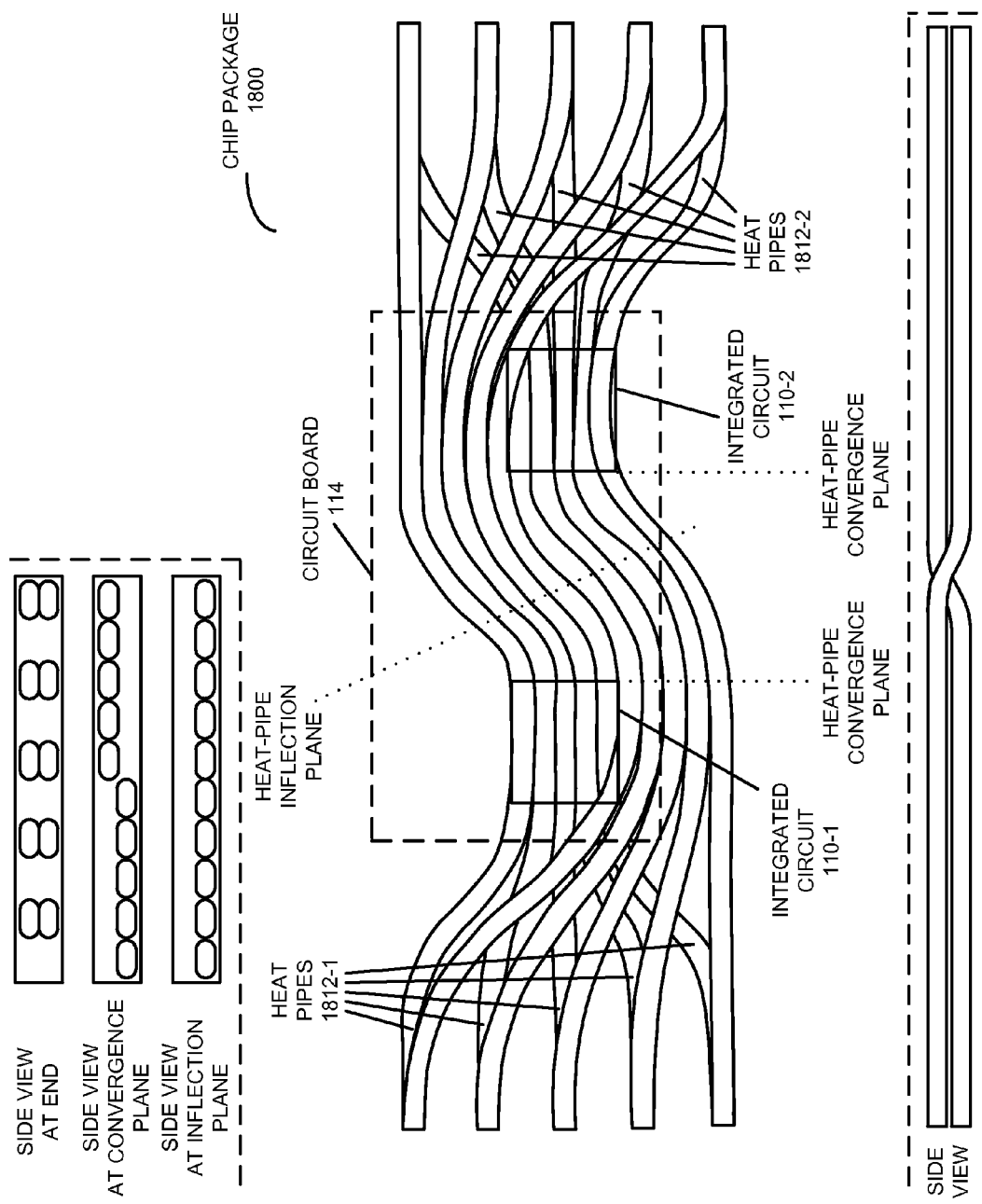
FIG. 18 is a block diagram illustrating a three-dimensionally curved heat pipes in heat sinks in accordance with an embodiment of the present disclosure.

In some embodiments, the heat pipes in the heat sinks may be curved in three dimensions. This is shown in FIG. 18, which presents a block diagram illustrating a three-dimensionally curved heat pipes 1812 in heat sinks 1810 of chip package 1800. For clarity, note that the fins are not shown in FIG. 18. By curving heat pipes 1812, a three-dimensional weave may be created, allowing heat sinks 1810 to curve up or down, or to cross each other in and around integrated circuits 110. In particular, the heat pipes are attached to one of the pedestals. Hence, these heat pipes are not interdigitated. Instead, each bunch of adjacent heat pipes reciprocally swerves around the other bunch. Moreover, each of the dies are covered by heat pipes 1812. Note that, at the heatpipe inflection plane, all of heatpipes 1812 are at the same height. Furthermore, at the heatpipe convergence plane, half the heatpipes are at the die surface level, while the other half are at the maximum height. Additionally, the height is ramped from die surface to top between the two convergence planes. In some embodiments, a staggered or flattened configuration of the heat pipes is used for improved performance and/or one or more heatpipes are shared.

This embodiment, as well as those illustrated in FIGS. 16 and 17, may allow the heat pipes to be routed to any region of a system where the heat flow is greatest (in doing so, they would naturally avoid any obstacles in their routing.) In FIG. 18, each heat sink is, reciprocally, an obstacle to the other. These obstacles can be avoided by having the heat pipes of each heat sink reciprocally swerve around those of the other heat sink.

Figure 19:
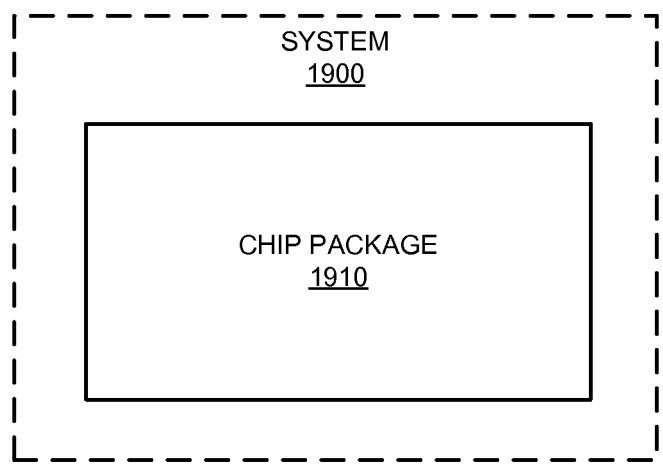
FIG. 19 is a block diagram illustrating a system that includes a chip package in accordance with an embodiment of the present disclosure.

Embodiments of the chip package and/or the winged heat sink may be used in a wide variety of applications, such as: a die stack in a memory application, flip-chip bonding and/or multi-layer stacks. A general application of a system (such as an electronic device) is shown in FIG. 19, which presents a block diagram illustrating a system 1900. This system includes chip package 1910, which may include one or more of the chip packages in the preceding embodiments (including those with the heat sinks having interdigitated heat pipes and/or the winged heat sink).

Chip package 1910 may include: VLSI circuits, communication systems (such as in wavelength division multiplexing), storage area networks, data centers, networks (such as local area networks), and/or computer systems (such as multiple processor-core computer systems). For example, a chip package may be included in a backplane that is coupled to multiple processor blades, or a chip package may couple different types of components (such as processors, memory, I/O devices, and/or peripheral devices). In some embodiments, a chip package performs the functions of: a switch, a hub, a bridge, and/or a router.

Note that system 1900 may include, but is not limited to: a server, a laptop computer, a communication device or system, a personal computer, a work station, a mainframe computer, a blade, an enterprise computer, a data center, a portable-computing device, a tablet computer, a supercomputer, a network-attached-storage (NAS) system, a storage-area-network (SAN) system, and/or another electronic computing device. Moreover, note that a given computer or computer system may be at one location or may be distributed over multiple, geographically dispersed locations.

The embodiments of the chip package, the winged heat sink and/or the system may include fewer components or additional components. For example, there may be more than two interdigitated heat sinks in the chip package. Furthermore, although the chip package, the winged heat sink and the system in the preceding discussion are illustrated as having a number of discrete items, these embodiments are intended to be functional descriptions of the various features that may be present rather than structural schematics. Consequently, in these embodiments two or more components may be combined into a single component, and/or a position of one or more components may be changed.

Note that the circuit board in the preceding embodiments may include: a semiconductor (such as silicon or a silicon-on-insulator wafer), an organic material, a ceramic, glass, and/or a plastic.

We now describe embodiments of the method. FIG. 20 presents a flow diagram illustrating a method 2000 for cooling a first integrated circuit and a second integrated circuit during operation of the first integrated circuit and the second integrated circuit, which may be performed using one of the embodiments of heat sinks having interdigitated heat pipes. During the method, heat is conducted away from the first integrated circuit using a first heat sink mechanically coupled to the first integrated circuit (operation 2010). Moreover, heat is conducted away from the second integrated circuit using a second heat sink mechanically coupled to the second integrated circuit (operation 2012), where the first integrated circuit is adjacent to the second integrated circuit. Furthermore, a given heat sink for a given integrated circuit includes: a pedestal region mechanically coupled to the given integrated circuit; a ramp region that extends a vertical position of the portion of the given heat sink; and a fin region having fins that convectively transfer the heat to an external fluid. Additionally, first heat pipes in the fin region of the first heat sink are interdigitated with second heat pipes in the fin region of the second heat sink.

FIG. 21 presents a flow diagram illustrating a method 2100 for cooling an integrated circuit using a heat sink, which may be performed using one of the embodiments of the winged heat sink. During the method, heat is transported from the integrated circuit to convective fins using an arm in the heat sink (operation 2110), where the arm extends a vertical position of the heat sink from a plane of the integrated circuit to a second vertical position, which is further away from the integrated circuit. Then, the convective fins are convectively cooled, where the convective fins extend downward from the arm back towards the integrated circuit (operation 2114).

In some embodiments, during the transport (operation 2110), the heat is optionally spread over the heat sink using a heat-sink base in the heat sink (operation 2112).

Moreover, in some embodiments the heat is optionally transported from the integrated circuit to additional convective fins using the arm (operation 2116). For example, the additional convective fins may extend upward away from the integrated circuit and/or may extend approximately parallel to a plane of the integrated circuit. Then, the additional convective fins are optionally convectively cooled (operation 2118).

In some embodiments, methods 2000 (FIG. 20) and/or 2100 include additional or fewer operations. Moreover, the order of the operations may be changed, and/or two or more operations may be combined into a single operation.

In the preceding description, we refer to 'some embodiments.' Note that 'some embodiments' describes a subset of all of the possible embodiments, but does not always specify the same subset of embodiments.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A heat sink, comprising:
a first pedestal configured to thermally couple to a first integrated circuit mounted on a circuit board;
a first arm thermally coupled to the first pedestal, wherein the first arm is a first heat pipe, wherein the first arm extends a vertical position of the a first heat sink from a plane defined by a top surface of the first pedestal to a second vertical position, the second vertical position is further away from the circuit board than the top surface of the first pedestal, wherein the first heat pipe has a wall-and-wick structure, wherein the first heat pipe comprises first convective fins thermally coupled to the first arm, wherein the first convective fins extend downward from the first arm back toward the circuit board, wherein the first convective fins are variable-length fins, and wherein the first convective fins form scallops to clear a second heat pipe and to optimize cooling efficiency of the first convective fins;
a second pedestal configured to thermally couple to a second integrated circuit mounted on the circuit board;
a third arm thermally coupled to the second pedestal, wherein the third arm is the second heat pipe, wherein the third arm extends a vertical position of a second heat sink from a plane defined by a top surface of the second pedestal to a third vertical position, the third vertical position is between the plane defined by the top surface of the first pedestal and the second vertical position, wherein the second heat pipe has a wall-and-wick structure, wherein the second heat pipe comprises second convective fins thermally coupled to the third arm, wherein the second convective fins extend upward from the third arm away from the circuit board, wherein the second convective fins are variable-length fins, and wherein the second convective fins form scallops to clear the first heat pipe and to optimize cooling efficiency of the second convective fins, and
wherein the first convective fins are interleaved with the second convective fins.

2. The heat sink of claim 1, wherein the first heat sink further includes a second arm, thermally coupled to the first pedestal, on an opposite side of the first integrated circuit from the first arm; wherein the second arm extends the vertical position of the first heat sink; and wherein the second arm is thermally coupled to the first convective fins.

3. The heat sink of claim 1, wherein the first heat sink further includes additional fins thermally coupled to the first arm; and wherein the additional fins extend upward away from the circuit board.

4. The heat sink of claim 1, wherein the first heat sink further includes additional fins thermally coupled to the first arm; and wherein the additional fins extend parallel to the plane of the first pedestal.

5. The heat sink of claim 1, wherein, during operation, the first heat sink is configured to transport heat from the first integrated circuit to the first convective fins.

6. The heat sink of claim 1, wherein the first heat sink further includes multiple arms arranged adjacent to each other, wherein the multiple arms include the first arm; and wherein, during operation, the first heat sink is configured to transport heat from the first integrated circuit in two dimensions to the first convective fins.

7. The heat sink of claim 1, wherein the first heat sink further includes a heat-sink base thermally coupled to at least a portion of the first arm; and wherein the heat-sink base is configured to spread heat over the first arm.

8. A system, comprising:
a first integrated circuit mounted on a circuit board; and
a first heat sink, wherein the first heat sink includes:
a first pedestal thermally coupled to the first integrated circuit;
a first arm thermally coupled to the first pedestal, wherein the first arm is a first heat pipe, wherein the first arm extends a vertical position of the first heat sink from a plane defined by a top surface of the first pedestal to a second vertical position, the second vertical position is further away from the circuit board than the top surface of the first pedestal, wherein the first heat pipe has a wall-and-wick structure, wherein the first heat pipe comprises first convective fins thermally coupled to the first arm, wherein the first convective fins extend downward from the first arm back toward the circuit board, wherein the first convective fins are variable-length fins, and wherein the first convective fins form scallops to clear a second heat pipe and to optimize cooling efficiency of the first convective fins;
a second pedestal configured to thermally couple to a second integrated circuit mounted on the circuit board;
a third arm thermally coupled to the second pedestal, wherein the third arm is the second heat pipe, wherein the third arm extends a vertical position of a second heat sink from a plane defined by a top surface of the second pedestal to a third vertical position, the third vertical position is between the plane defined by the top surface of the first pedestal and the second vertical position, wherein the second heat pipe has a wall-and-wick structure, wherein the second heat pipe comprises second convective fins thermally coupled to the third arm, wherein the second convective fins extend upward from the third arm away from the circuit board, wherein the second convective fins are variable-length fins, wherein the second convective fins form scallops to clear the first heat pipe and to optimize cooling efficiency of the second convective fins, and wherein the first convective fins are interleaved with the second convective fins.

9. The system of claim 8, wherein the system further includes a component in the components, the component having a height mounted on the circuit board proximate to the first integrated circuit; and wherein the second vertical position clears the height.

10. The system of claim 9, wherein the first convective fins have different lengths to accommodate the height of the component.

11. The system of claim 8, wherein the first heat sink further includes a second arm, thermally coupled to the first pedestal, on an opposite side of the first integrated circuit from the first arm; wherein the second arm extends the vertical position of the first heat sink; and wherein the second arm is thermally coupled to the first convective fins.

12. The system of claim 8, wherein the first heat sink further includes additional fins thermally coupled to the first arm; and wherein the additional fins extend upward away from the circuit board.

13. The system of claim 8, wherein the first heat sink further includes additional fins thermally coupled to the first arm; and wherein the additional fins extend parallel to the plane of the first pedestal.

14. The system of claim 8, wherein, during operation, the first heat sink is configured to transport heat from the first integrated circuit to the first convective fins.

15. The system of claim 8, wherein the first heat sink further includes multiple arms arranged adjacent to each other, wherein the multiple arms include the first arm; and wherein, during operation, the first heat sink is configured to transport heat from the first integrated circuit in two dimensions to the first convective fins.

16. The system of claim 8, wherein the first heat sink further includes a heat-sink base thermally coupled to at least a portion of the first arm; and wherein the heat-sink base is configured to spread heat over the first arm.

17. A method for cooling a first integrated circuit using a first heat sink, wherein the method comprises:
transporting heat from the first integrated circuit to first convective fins using a first arm in the first heat sink, wherein the first arm is a first heat pipe, wherein the first arm extends a vertical position of the first heat sink from a plane defined by a top surface of the first integrated circuit to a second vertical position, the second vertical position is further away from the circuit board than the top surface of the first integrated circuit, the circuit board coupled to the integrated circuit, wherein the heat pipe has a wall-and-wick structure, wherein the first heat pipe comprises first convective fins thermally coupled to the first arm, wherein the first convective fins extend downward from the first arm back toward the circuit board, wherein the first convective fins are variable-length fins, and wherein the first convective fins form scallops to clear a second heat pipe and to optimize cooling efficiency of the first convective fins;
providing a second integrated circuit coupled to the circuit board;
providing a third arm thermally coupled to the second integrated circuit, wherein the third arm is the second heat pipe, wherein the third arm extends a vertical position of a second heat sink from the plane defined by a top surface of a second integrated circuit to a third vertical position, the third vertical position is between the plane defined by the top surface of the first integrated circuit and the second vertical position, wherein the second heat pipe has a wall-and-wick structure, wherein the second heat pipe comprises second convective fins thermally coupled to the third arm, wherein the second convective fins extend upward from the third arm away from the circuit board, wherein the second convective fins are variable-length fins, wherein the second convective fins form scallops to clear the first heat pipe and to optimize cooling efficiency of the second convective fins, and
wherein the first convective fins are interleaved with the second convective fins.

18. The method of claim 17, wherein, during the transport, the method further comprises spreading the heat over the first heat sink using a heat-sink base in the first heat sink.

19. The method of claim 17, wherein the method further comprises:
transporting the heat from the first integrated circuit to additional convective fins using the first arm, where the additional convective fins extend upward away from the first integrated circuit; and
convectively cooling the additional convective fins.

20. The method of claim 17, wherein the method further comprises:
transporting the heat from the first integrated circuit to additional convective fins using the first arm, where the additional convective fins extend parallel to the plane defined by the top surface of the first integrated circuit; and
convectively cooling the additional convective fins.

* * * * *

UNITED STATES PATENT AND TRADEMARK OFFICE
CERTIFICATE OF CORRECTION

PATENT NO. : 9,773,718 B2
APPLICATION NO. : 14/250237
DATED : September 26, 2017
INVENTOR(S) : David C. Douglas, David W. Copeland and Bruce M. Guenin Page 1 of 1

It is certified that error appears in the above-identified patent and that said Letters Patent is hereby corrected as shown below:

In the Specification (Column 1, Line 16), please delete, "14/205,233", and replace with --14/250,233--

(Column 14, Line 1), please delete, "heatpipe", and replace with --heat pipe--

(Column 14, Line 1), please delete, "heatpipes", and replace with --heat pipes--

(Column 14, Line 2), please delete, "heatpipe", and replace with --heat pipe--

In the Claims (Column 16, Claim 1, Line 7), please delete, "the a", and replace with --a--

Signed and Sealed this
Eighth Day of January, 2019

Andrei Iancu
*Director of the United States Patent and Trademark Office*